(12) United States Patent
Taguchi et al.

(10) Patent No.: US 12,477,905 B2
(45) Date of Patent: Nov. 18, 2025

(54) LIGHT EMITTING DEVICE, MANUFACTURING METHOD THEREOF, DISPLAY DEVICE, PHOTOELECTRIC CONVERSION DEVICE, ELECTRONIC APPARATUS, ILLUMINATION DEVICE, AND MOVING BODY

(71) Applicant: CANON KABUSHIKI KAISHA, Tokyo (JP)

(72) Inventors: Yoshiaki Taguchi, Kanagawa (JP); Koji Ishizuya, Kanagawa (JP); Masahiko Sone, Kanagawa (JP); Akinori Makaino, Kanagawa (JP); Toshihiro Shoyama, Kanagawa (JP); Kentaro Suzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 382 days.

(21) Appl. No.: 18/303,751

(22) Filed: Apr. 20, 2023

(65) Prior Publication Data

US 2023/0354651 A1 Nov. 2, 2023

(30) Foreign Application Priority Data

Apr. 28, 2022 (JP) ................................. 2022-075409
Feb. 27, 2023 (JP) ................................. 2023-028841

(51) Int. Cl.
*H04N 23/53* (2023.01)
*H10K 59/12* (2023.01)
(Continued)

(52) U.S. Cl.
CPC ........... *H10K 59/122* (2023.02); *H04N 23/53* (2023.01); *H10K 59/1201* (2023.02); *H10K 59/38* (2023.02); *H10K 59/879* (2023.02)

(58) Field of Classification Search
CPC .. H04N 23/53; H10K 59/122; H10K 59/1201; H10K 59/38; H10K 59/879
(Continued)

(56) References Cited

U.S. PATENT DOCUMENTS 7,531,834 B2 5/2009 Lee
7,888,867 B2 2/2011 Yoshida
(Continued)

FOREIGN PATENT DOCUMENTS

JP 2006-140145 A 6/2006
JP 2006-228648 A 8/2006
(Continued)

OTHER PUBLICATIONS

Dec. 20, 2023 Indian Official Action in Indian Patent Appln. No. 202344029455.
(Continued)

*Primary Examiner* — Omar F Mojaddedi
(74) *Attorney, Agent, or Firm* — Venable LLP

(57) ABSTRACT

A light emitting device includes a plurality of first electrodes, an organic layer located above the plurality of first electrodes and including a light emitting layer, a second electrode located above the organic layer, and an insulating layer that separates the plurality of first electrodes from each other. An upper surface of each of the plurality of first electrodes includes an inner region in contact with the organic layer, and an outer region in contact with the insulating layer. The insulating layer includes an opening that defines the inner region, and a step located at a position away from the opening and overlapping the outer region.

18 Claims, 15 Drawing Sheets

(51) Int. Cl.
  *H10K 59/122* (2023.01)
  *H10K 59/38* (2023.01)
  *H10K 59/65* (2023.01)
  *H10K 59/80* (2023.01)
  *H10K 59/90* (2023.01)

(58) Field of Classification Search
  CPC ............ H10K 59/65; H10K 59/80518; H10K 59/8052; H10K 59/90
  See application file for complete search history.

(56) References Cited

U.S. PATENT DOCUMENTS

| | | | |
|---|---|---|---|
| 8,981,352 B2 | 3/2015 | Yamada | |
| 9,324,947 B2 | 4/2016 | Sato | |
| 9,515,132 B2 | 12/2016 | Sato | |
| 11,393,879 B2 | 7/2022 | Sano | |
| 11,839,131 B2 | 12/2023 | Takahashi | |
| 2006/0097263 A1 | 5/2006 | Lee | |
| 2008/0030119 A1 | 2/2008 | Ito | |
| 2010/0213827 A1 | 8/2010 | Yoshida | |
| 2012/0248475 A1 | 10/2012 | Yamada | |
| 2015/0069361 A1* | 3/2015 | Sato | H10K 71/211 438/34 |
| 2016/0204187 A1* | 7/2016 | Sato | H10K 71/211 257/40 |
| 2017/0358770 A1* | 12/2017 | Maeda | H10K 59/1315 |
| 2018/0315946 A1* | 11/2018 | Nagatomo | H10K 59/122 |
| 2019/0043934 A1* | 2/2019 | Ukigaya | H10K 59/38 |
| 2019/0067392 A1 | 2/2019 | Baik | |
| 2019/0067644 A1 | 2/2019 | Choi | |
| 2019/0096971 A1* | 3/2019 | Ukigaya | H10K 59/122 |
| 2020/0212133 A1* | 7/2020 | Gee | H10K 59/88 |
| 2021/0066411 A1* | 3/2021 | Takahashi | H10K 50/856 |
| 2021/0305323 A1 | 9/2021 | Ishizuya | |
| 2022/0115447 A1 | 4/2022 | Ishizuya | |
| 2022/0131112 A1 | 4/2022 | Hinata | |

FOREIGN PATENT DOCUMENTS

| | | |
|---|---|---|
| JP | 2010-176937 A | 8/2010 |
| JP | 2012-216338 A | 11/2012 |
| JP | 2015-053215 A | 3/2015 |
| JP | 2021-039847 A | 3/2021 |
| WO | 2009/084209 A1 | 7/2009 |

OTHER PUBLICATIONS

Nov. 25, 2024 Japanese Official Action in Japanese Patent Appln. No. 2023-028841.
Jul. 26, 2024 Japanese Official Action in Japanese Patent Appln. No. 2023-028841.
Jun. 28, 2023 European Official Action in European Patent Appln. No. 23165416.1.
Mar. 18, 2024 Japanese Official Action in Japanese Patent Appln. No. 2023-028841.
Sep. 11, 2024 European Official Action in European Patent Appln. No. 23165416.1.

\* cited by examiner

LIGHT EMITTING DEVICE, MANUFACTURING METHOD THEREOF, DISPLAY DEVICE, PHOTOELECTRIC CONVERSION DEVICE, ELECTRONIC APPARATUS, ILLUMINATION DEVICE, AND MOVING BODY

BACKGROUND OF THE INVENTION

Field of the Invention

The present invention relates to a light emitting device, a manufacturing method thereof, a display device, a photoelectric conversion device, an electronic apparatus, an illumination device, and a moving body.

Description of the Related Art

In recent years, the pixel density in a display device using organic EL elements is increasing. Along with this, a leak current is readily generated between pixels through an organic layer commonly provided with respect to multiple pixels. If the leak current is generated, a non-light emitting pixel is influenced by a light emitting element, and slightly emits light. This causes color mixing and a decrease in light emission efficiency. Japanese Patent Laid-Open No. 2012-216338 proposes that, in order to reduce the leak current between pixels, a groove is formed in an insulating layer, which separates the anode electrodes of organic EL elements from each other, to decrease the film thickness of the low resistance organic layer in the groove. With the method of forming the groove in the insulating layer at a position between pixels as described above, a current flows up to the vicinity of the groove through the low resistance organic layer. Due to this current, light emission occurs not only in a portion of the organic layer in contact with the anode electrode but also in its vicinity. In a light emitting device having a structure that increases the light emission intensity by the interference effect of light, if the spread of the light emitting portion is large, the light emission efficiency may decrease.

SUMMARY OF THE INVENTION

Some aspects of this disclosure provide a technique for improving the light emission efficiency of a light emitting device.

According to an embodiment, a light emitting device includes a plurality of first electrodes, an organic layer located above the plurality of first electrodes and including a light emitting layer, a second electrode located above the organic layer, and an insulating layer that separates the plurality of first electrodes from each other. An upper surface of each of the plurality of first electrodes includes an inner region in contact with the organic layer, and an outer region in contact with the insulating layer. The insulating layer includes an opening that defines the inner region, and a step located at a position away from the opening and overlapping the outer region.

Further features of the present invention will become apparent from the following description of exemplary embodiments with reference to the attached drawings.

DESCRIPTION OF THE EMBODIMENTS

Figure 1:
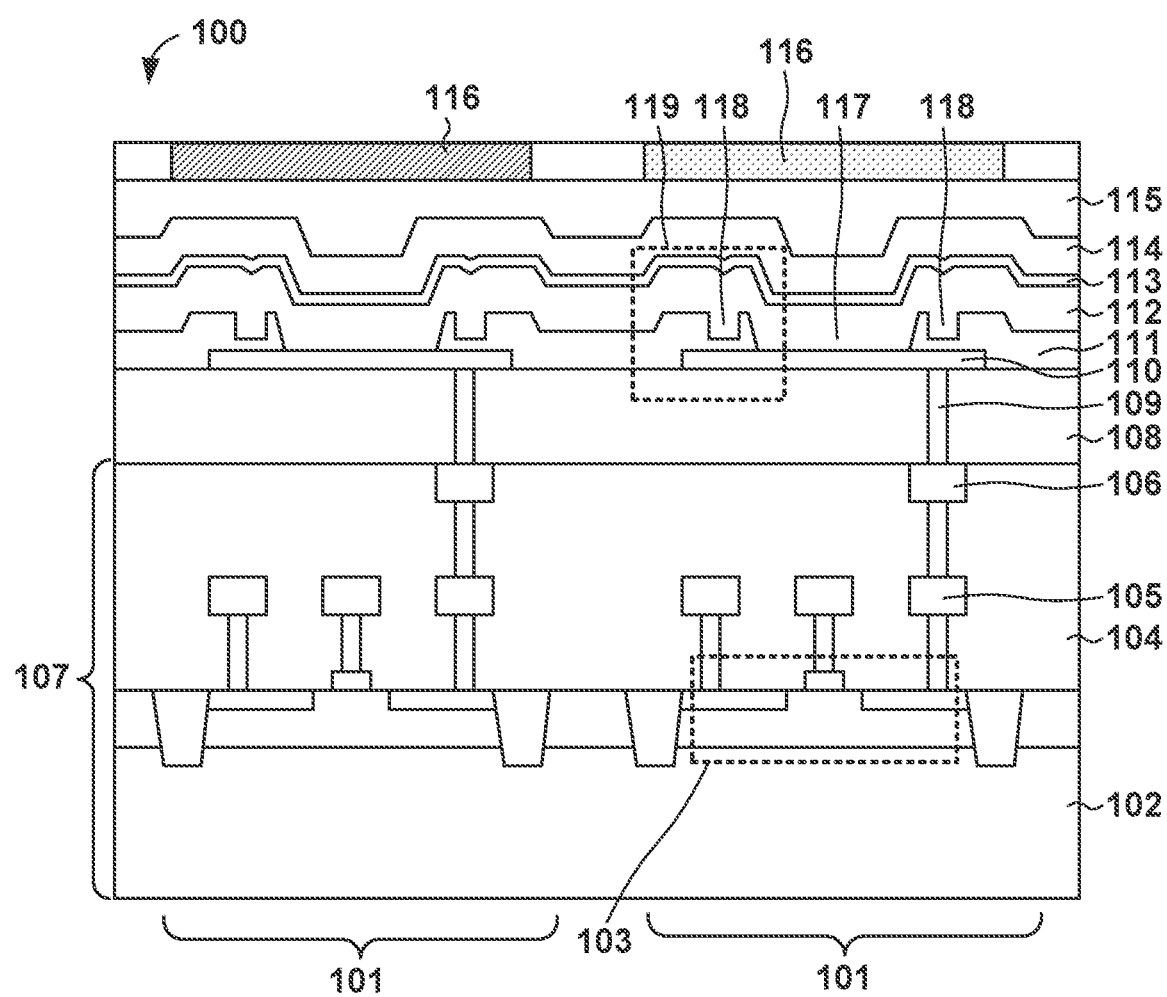
FIG. 1 is a sectional view for explaining an arrangement example of a light emitting device according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figure 2:
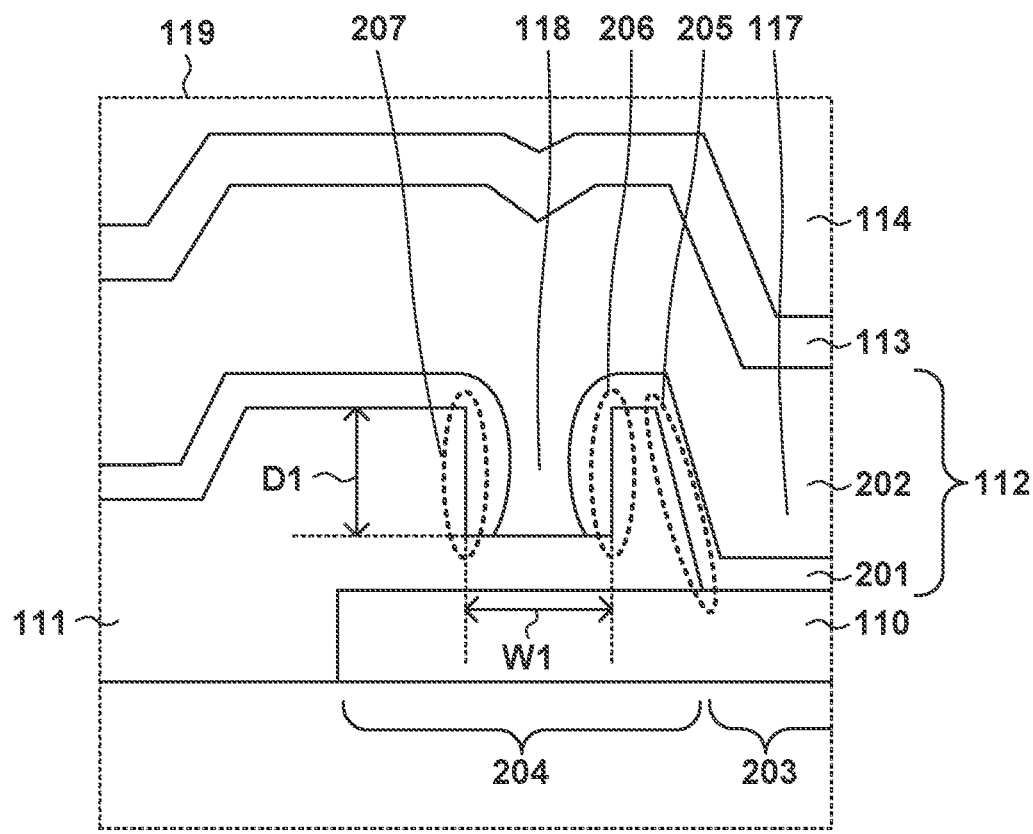
FIG. 2 is an enlarged view for explaining the arrangement example of the light emitting device according to the first embodiment.
Figure 3:
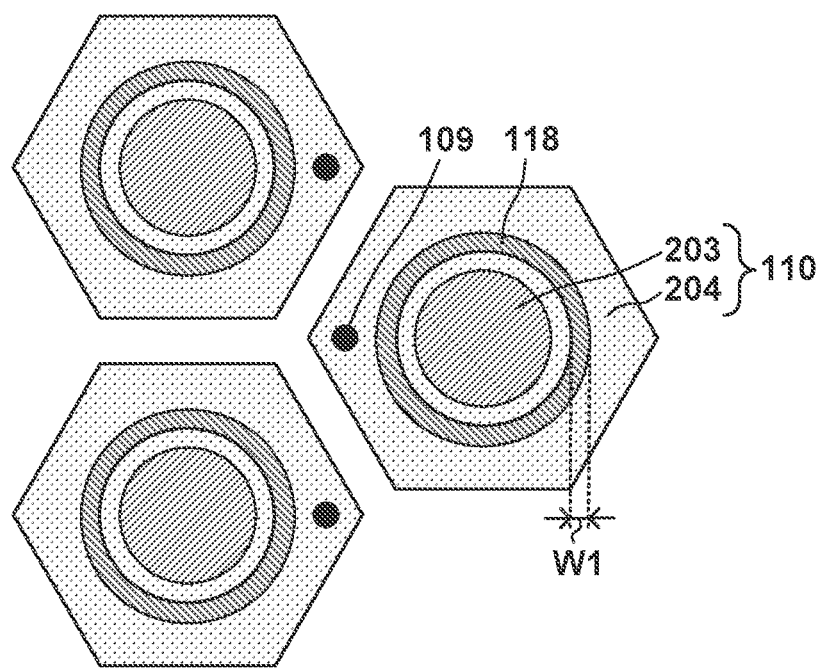
FIG. 3 is a plan view for explaining the arrangement example of the light emitting device according to the first embodiment.

With reference to FIGS. 1 to 3, an arrangement example of a light emitting device 100 according to the first embodiment will be described. FIG. 1 shows a schematic sectional view of the light emitting device 100 taken along a plane passing through a light emitting circuit 101. The light emitting device 100 includes a plurality of light emitting circuits 101. When the light emitting device 100 is used for a display device, each of the plurality of light emitting circuits 101 may function as a pixel. The following description of one light emitting circuit 101 among the plurality of light emitting circuits 101 may be similarly applied to each light emitting circuit 101 among the plurality of light emitting circuits 101.

The light emitting device 100 includes a substrate 102, and various components formed on the substrate 102. The substrate 102 includes a transistor 103. Each of the plurality of light emitting circuits 101 may include the individual transistor 103. The light emitting device 100 includes an insulating layer 104 on the substrate 102. The upper surface of the insulating layer 104 has been planarized. The light emitting device 100 includes conductive patterns 105 and 106 in the insulating layer 104. The conductive pattern 105 is connected to a circuit element (for example, transistor 103) formed in the substrate 102 by a contact plug. The conductive pattern 106 is connected to the conductive pattern 105 by the contact plug. The circuit element (for example, transistor 103) formed in the substrate 102, the conductive patterns 105 and 106, and the contact plug connecting them form a driving circuit 107 configured to drive the light emitting element to be described later.

The light emitting device 100 includes an insulating layer 108 on the insulating layer 104. The upper surface of the insulating layer 108 is planarized. The light emitting device 100 includes a contact plug 109 in the insulating layer 108. The contact plug 109 extends through the insulating layer 108, and connects the conductive pattern 106 and a lower electrode 110 to be described later.

The light emitting device 100 includes a plurality of lower electrodes 110 on the insulating layer 108. The plurality of lower electrodes 110 are separated from each other. Each of the plurality of light emitting circuits 101 may include the individual lower electrode 110. The upper surface of each of the plurality of lower electrodes 110 is flat. The light emitting device 100 includes an organic layer 112 on the plurality of lower electrodes 110. The organic layer 112 is arranged over the plurality of light emitting circuits 101. The light emitting device 100 includes an upper electrode 113 on the organic layer 112. The upper electrode 113 is arranged over the plurality of light emitting circuits 101. The light emitting device 100 includes an insulating layer 111 between the insulating layer 108 and the organic layer 112.

The insulating layer 111 separates the plurality of lower electrodes 110 from each other. The insulating layer 111 is in contact with a portion of the insulating layer 108 not covered with the plurality of lower electrodes 110, the side surface of each of the plurality of lower electrodes 110, and the upper surface of each of the plurality of lower electrodes 110. An opening 117 is formed in the insulating layer 111 at a position overlapping the individual lower electrode 110. The organic layer 112 is in contact with a part of the upper surface of the individual lower electrode 110 through the opening 117. Grooves 118 are formed in the insulating layer 111. Details of the groove 118 will be described later.

The individual lower electrode 110, the organic layer 112, and the upper electrode 113 form a light emitting element. Since the light emitting element includes the organic layer 112, it can be called an organic electroluminescence (EL) element. The individual lower electrode 110 can function as the anode of the light emitting element. The upper electrode 113 can function as the cathode of the light emitting element. One organic layer 112 and one upper electrode 113 are commonly used by a plurality of light emitting elements.

The light emitting device 100 includes a moisture preventing layer 114 on the upper electrode 113. The moisture preventing layer 114 is arranged over the plurality of light emitting circuits 101. The light emitting device 100 includes a planarizing layer 115 on the moisture preventing layer 114. The planarizing layer 115 is arranged over the plurality of light emitting circuits 101. The upper surface of the planarizing layer 115 is planarized. The light emitting device 100 includes a plurality of color filters 116 on the planarizing layer 115. Each of the plurality of light emitting circuits 101 may include the individual color filter 116. All the light emitting elements of the plurality of light emitting circuits 101 may be configured to emit white light. When the white light is transmitted through the color filters 116, it is separated into respective colors of red, green, and blue, and emitted.

With reference to FIG. 2, the groove 118 will be described in detail. FIG. 2 is an enlarged view of a portion surrounded by a dashed line 119 in FIG. 1. The organic layer 112 in this embodiment has a stacked structure including a low resistance layer 201 and a light emitting layer 202. Each of the low resistance layer 201 and the light emitting layer 202 is formed of an organic material. Each of the low resistance layer 201 and the light emitting layer 202 is arranged over the plurality of light emitting circuits 101. The low resistance layer 201 is located between the light emitting layer 202 and the plurality of lower electrodes 110. The resistance value of the low resistance layer 201 is smaller than the resistance value of the light emitting layer 202. The low resistance layer 201 may be a hole injection layer, a hole transport layer, or a charge generation layer, or may be a combination of these layers. The light emitting layer 202 emits light in accordance with a current flowing through the light emitting layer 202. In the example shown in FIG. 2, the organic layer 112 includes one low resistance layer 201 and one light emitting layer 202. Alternatively, the organic layer 112 may include light emitting layers corresponding to a plurality of light emission colors, and emit white light.

The upper surface of the individual lower electrode 110 includes an inner region 203 and an outer region 204. The outer region 204 is located outside the inner region 203. The inner region 203 may be wholly surrounded by the outer region 204. The inner region 203 is defined by the opening 117 of the insulating layer 111. In other words, of the upper surface of the individual lower electrode 110, a portion not covered with the insulating layer 111 (a portion overlapping the opening 117) serves as the inner region 203. The inner region 203 is in contact with the organic layer 112 (more specifically, the low resistance layer 201 thereof). The outer region 204 is in contact with the insulating layer 111.

The groove 118 is located at a position away from the opening 117 and overlapping the flat portion of the outer region 204. The groove 118 forms steps 206 and 207. The step may be a structure formed from two flat portions having different heights from a reference plane (for example, the flat portion of the outer region 204), and a portion connecting these two portions. The steps 206 and 207 are steps different from a step 205 facing the opening 117. The groove 118 does not reach the lower electrode 110. That is, the bottom surface of the groove 118 is formed from a part of the insulating layer 111. The inclination of the slope of each of the steps 206 and 207 (that is, the side wall of the groove 118) may be steeper than the inclination of the slope of the step 205 (that is, the side wall facing the opening 117).

The organic layer 112 has entered the groove 118. As will be described later, when the low resistance layer 201 is formed by vapor deposition, the low resistance layer 201 may have a decreased thickness or be interrupted in the groove 118. In other words, the distance between the bottom of the groove 118 and the light emitting layer 202 is smaller than the distance between the vicinity of the groove 118 and the light emitting layer 202. In the example shown in FIG. 2, the low resistance layer 201 is interrupted in the groove 118. If the thickness of the low resistance layer 201 decreases in this manner, the resistance value increases in the corresponding portion. As a result, a current flowing from the individual lower electrode 110 to the low resistance layer 201 hardly flows over the groove 118. With this, the light emission amount of the light emitting layer 202 outside the groove 118 (that is, on the side away from the inner region 203) can be reduced. In addition, a leak current between the light emitting circuits 101 adjacent to each other can be reduced.

With reference to FIG. 3, a plan view of the light emitting device 100 will be described. More specifically, FIG. 3 shows the arrangement of the contact plug 109, the lower electrode 110, and the groove 118 in a planar view with respect to the principal surface (the surface where the insulating layer 104 and the like have been formed) of the substrate 102. Since the principal surface of the substrate 102 is parallel to the inner region 203, the planar view with respect to the principal surface of the substrate 102 coincides with the planar view with respect to the inner region 203.

As has been described above, the upper surface of the lower electrode 110 includes the inner region 203 and the outer region 204. In the example shown in FIG. 3, the groove 118 wholly surrounds the inner region 203 in the planar view with respect to the inner region 203. With this arrangement, a current flowing from the inner region 203 over the groove 118 can be reduced in all directions. Alternatively, the groove 118 may be separated into a plurality of portions, and partially surrounds the inner region 203 in the planar view with respect to the inner region 203. Even in this case, a current flowing over the groove 118 can be reduced in the direction where the groove 118 is located.

The area of the inner region 203 may be smaller than the area of the outer region 204. If the area of the outer region 204 is relatively large, the distance from the inner region 203 to the outside of the lower electrode 110 increases. Hence, by forming the groove 118 at a position overlapping the outer region 204, the range of the current flowing through the low resistance layer 201 can be reduced. Further, the groove 118 may be located between the contact plug 109 and the inner region 203 in the planar view with respect to the inner region 203. In this manner, by arranging the groove 118 near the inner region 203, the range of the current flowing through the low resistance layer 201 can be reduced. Alternatively, the groove 118 may be located at a position overlapping the contact plug 109, or may be located on the outer side of the contact plug 109.

The groove 118 has an aspect ratio that can decrease the thickness of the low resistance layer 201 in the groove 118. The aspect ratio is the ratio (D1/W1) of a depth D1 of the groove 118 to a width W1 of the groove 118. The width W1 of the groove 118 may be the distance between two side walls in a section (for example, the section shown in FIG. 2) orthogonal to the extending direction of the groove 118. If the distance between two side walls changes depending on the depth of the groove 118, the width W1 of the groove 118 may be the distance between two side walls at the intermediate depth, or may be the average of the distances between two side walls at a plurality of depths. The depth D1 of the groove 118 may be the distance between the bottom of the groove 118 and the portion around the groove 118 in the direction orthogonal to a reference plane (for example, the principal surface of the substrate 102). If the height of the portion around the groove 118 changes between the both sides of the groove 118, the depth D1 of the groove 118 may be the average of the depths on the respective sides.

The aspect ratio of the groove 118 may be, for example, 0.02 (inclusive) to 20 (inclusive), and may be, for example, 0.3 (inclusive) to 20 (inclusive). In other words, the depth D1 of the groove 118 may be 0.02 times (inclusive) to 20 times (inclusive) the width W1 of the groove 118, and may be, for example, 0.3 times (inclusive) to 20 times (inclusive) the width W1. Further, the aspect ratio of the groove 118 may be 1 or more. In order to set the aspect ratio as described above, the depth D1 of the groove 118 may fall in a range of, for example, 10 nm to 200 nm, and the width W1 of the groove 118 may fall in a range of, for example, 10 nm to 500 nm. The width W1 of the groove 118 may be larger than the film thickness of the low resistance layer 201.

The groove 118 may have an aspect ratio that can suppress a local increase in resistance of the upper electrode 113. For example, the aspect ratio of the groove 118 may be 1 or more. With this, for example, it is possible to suppress a degradation of the display performance such as shading (uneven luminance caused by a voltage drop in the surface of the upper electrode 113).

The width W1 and the depth D1 of the groove 118 may change depending on the position of the groove 118. For example, the width W1 and the depth D1 of the groove 118 may be selected based on the shape and arrangement of the light emitting element in the light emitting region, the resistance distribution of the upper electrode 113, and the like. In order to suppress a degradation of the light emission characteristic (a degradation of the color reproduction range due to color mixing) caused by a leak current between the light emitting circuits of different light emission colors, the aspect ratio of the groove 118 may be relatively increased between the light emitting circuits of different light emission colors.

Figure 4:
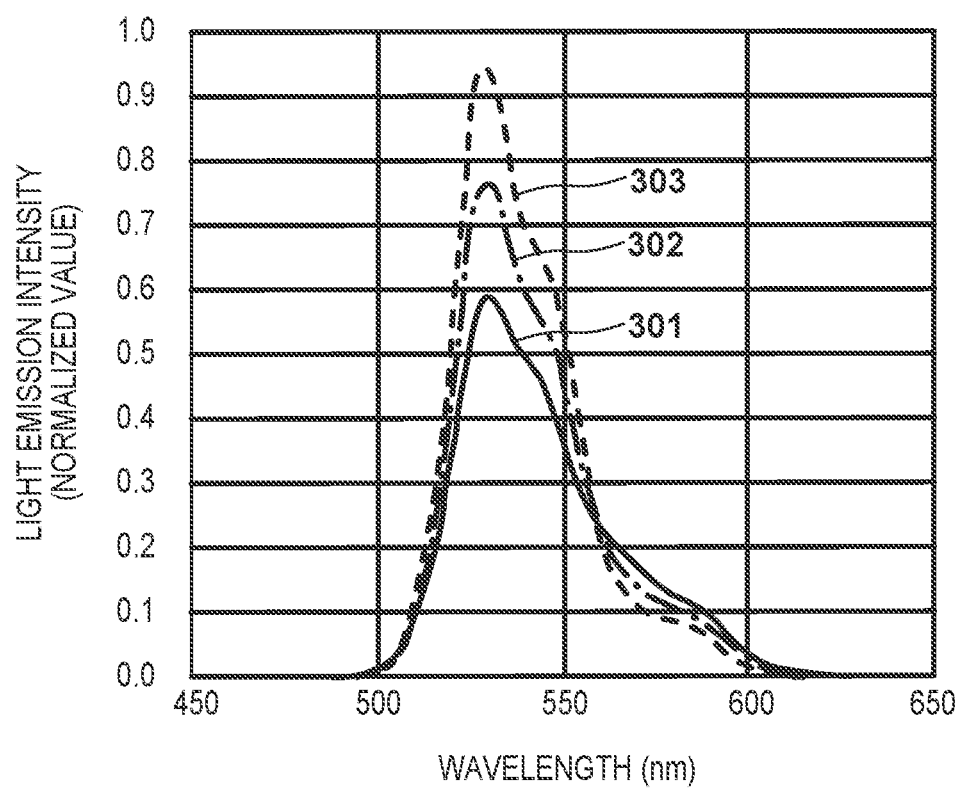
FIG. 4 is a graph for explaining the light emission intensity of the light emitting device according to the first embodiment.

With reference to FIG. 4, the difference in light emission intensity of the light emitting circuit 101 depending on the position of the groove 118 will be described. The abscissa of the graph of FIG. 4 represents the light emission wavelength, and the ordinate represents the intensity of light emitted from the light emitting circuit 101. FIG. 4 shows results of experiences conducted under the same conditions except for the distance between the groove 118 and the inner region 203 which was switched among three distances. Graph 301 shows the result in a case in which the distance between the groove 118 and the inner region 203 is largest. Graph 303 shows the result in a case in which the distance between the groove 118 and the inner region 203 is smallest. Graph 302 shows the result in a case in which the distance between the groove 118 and the inner region 203 is an intermediate distance. As can be seen from the results shown in FIG. 4, the smaller the distance between the groove 118 and the inner region 203, the higher the light emission intensity. Therefore, as in this embodiment, when the insulating layer 111 includes the groove 118 at the position overlapping the upper electrode 113, the light emission efficiency of the light emitting circuit 101 can be improved.

With reference to FIGS. 5A to 5E, an example of the manufacturing method of the light emitting device 100 will be described. In each of FIGS. 5A to 5E, a state halfway through the manufacturing of the light emitting device 100 is shown by a sectional view taken at the same position as in FIG. 1. First, the driving circuit 107 is formed in the substrate 102 and the insulating layer 104. The driving circuit 107 may be formed by an existing metal oxide semiconductor (MOS) process, and a detailed description thereof will be omitted. In each of FIGS. 5A to 5E, the substrate 102 and the insulating layer 104 are not shown.

Figure 5A:
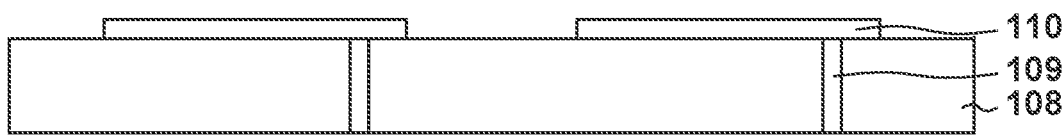
FIGS. 5A to 5E are sectional views for explaining an example of the manufacturing method of the light emitting device according to the first embodiment.

As shown in FIG. 5A, the insulating layer 108 including the contact plug 109 is formed on the insulating layer 104, and the plurality of lower electrodes 110 are formed on the insulating layer 108. For example, the insulating layer 108 may be formed by depositing an insulating film such as, for example, an oxide film (SiOx), an oxynitride film (SiON) or the like by, for example, a plasma chemical vapor deposition (CVD) method, a high-density plasma method, or a combination thereof. The surface of the insulating layer 108 may be planarized by a chemical mechanical polishing (CMP) method after the deposition. A plurality of openings are formed at predetermined positions of the insulating layer 108 by a photolithography method and a dry etching method. For example, tungsten (W) is arranged in each opening, an extra part is removed by the CMP method or an etch back method, and the remaining part serves as the contact plug 109.

Then, a stacked metal film formed of titanium (Ti), titanium nitride (TiN), an aluminum alloy, and titanium is deposited on the insulating layer 108 by, for example, a sputtering method. Next, the stacked metal film is patterned into a predetermined shape using the photolithography method and the dry etching method or the wet etching method, thus forming the plurality of lower electrodes 110.

Figure 5B:
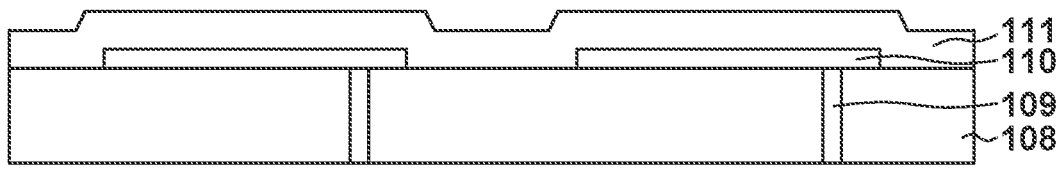

Subsequently, as shown in FIG. 5B, the insulating layer 111 is formed by depositing, on the plurality of lower electrodes 110, an insulating layer such as, for example, an oxide film (SiOx), an oxynitride film (SiON), or a silicon nitride film (SiNx), by the plasma CVD method. The film thickness of the insulating layer 111 may be, for example, 1 nm to 500 nm. The deposition method of the insulating layer 111 is not limited to the method described above, and an arbitrary method of forming an insulating layer may be used. For example, as a manufacturing method other than the above-described method, the high-density plasma CVD method, an atomic layer deposition (ALD) method, the sputtering method, or spin coating or slit coating of a coating material may be used. The insulating layer 111 may be formed by stacking a plurality of layers. The plurality of layers may be formed of the same material, or layers made of different materials may be mixed.

Figure 5C:
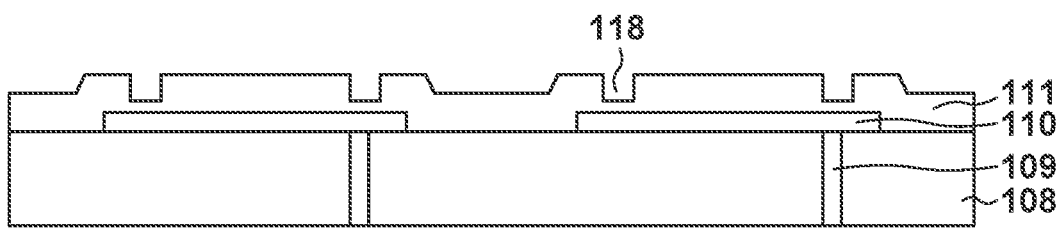
Figure 5D:
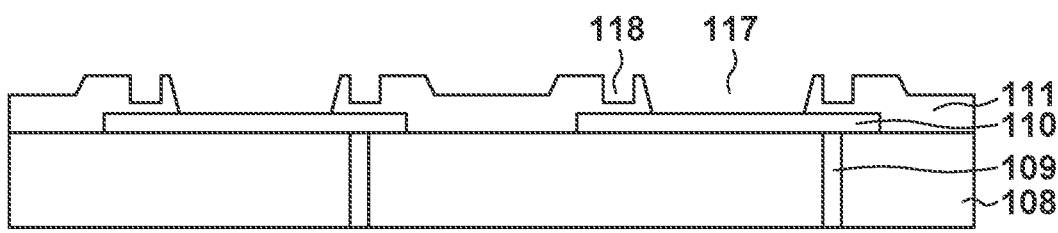

Next, as shown in FIG. 5C, the groove 118 is formed by patterning the insulating layer 111 into a predetermined shape using the photolithography method and the dry etching method or the wet etching method. The groove 118 is formed at a position overlapping the outer region 204 of the individual lower electrode 110. Further, as shown in FIG. 5D, the opening 117 is formed by patterning the insulating layer 111 into a predetermined shape using the photolithography method and the dry etching method or the wet etching method. The opening 117 is formed at a position overlapping the inner region 203 of the individual lower electrode 110.

Together with formation of the opening 117, an opening for connecting the upper electrode 113 to be formed in the subsequent step to a metal layer in the same layer as the lower electrode 110 may be formed. The groove 118 may be formed after the opening 117. Then, by cleaning the surfaces of the lower electrode 110 and the insulating layer 111, foreign materials are removed from the surfaces. After the cleaning step, a dewatering process is performed to remove water on the substrate surface.

Figure 5E:
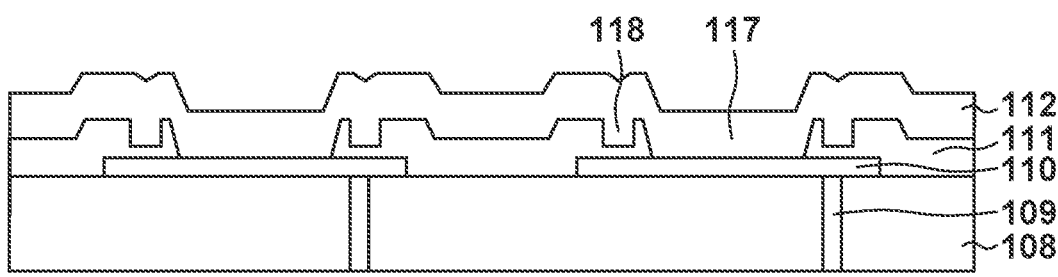

Next, as shown in FIG. 5E, the organic layer 112 including the light emitting layer 202 is formed on the insulating layer 111 in which the groove 118 and the opening 117 have been formed. As has been described above, the organic layer 112 may include the low resistance layer 201. The low resistance layer 201 may be a hole injection layer, a hole transport layer, a charge generation layer, or a combination thereof. The low resistance layer 201 and the light emitting layer 202 may be formed by vaper-depositing an organic material by, for example, a vacuum vapor deposition method. An electron transport layer may be further formed on the light emitting layer 202. As the vacuum vapor deposition method, for example, a rotation vapor deposition method, a line vapor deposition method, a transfer vapor deposition method, or the like may be used.

Subsequently, without continuously releasing the decompressed atmosphere to the atmosphere, the upper electrode 113 is formed on the organic layer 112 by the vacuum vapor deposition method. Then, the moisture preventing layer 114 is deposited so as to cover the upper electrode 113 by, for example, the plasma CVD method, the sputtering method, the ALD method, or a combination thereof. The deposition temperature of the moisture preventing layer 114 may be equal to or lower than the decomposition temperature of the organic material forming the organic layer 112, for example, be equal to or lower than 120° C. Then, the planarizing layer 115 for improving the adhesiveness is formed on the moisture preventing layer 114. Then, a red filter is formed on the planarizing layer 115 by applying a material of the red filter and patterning it by photolithography. By sequentially forming a green filter and blue filter in a similar manner, the color filters 116 are formed. Then, a terminal extraction pad portion in the light emitting device 100 is formed by patterning into a predetermined shape by the photolithography method and the dry etching method. In this manner, the light emitting device 100 shown in FIG. 1 is manufactured.

Figure 6:
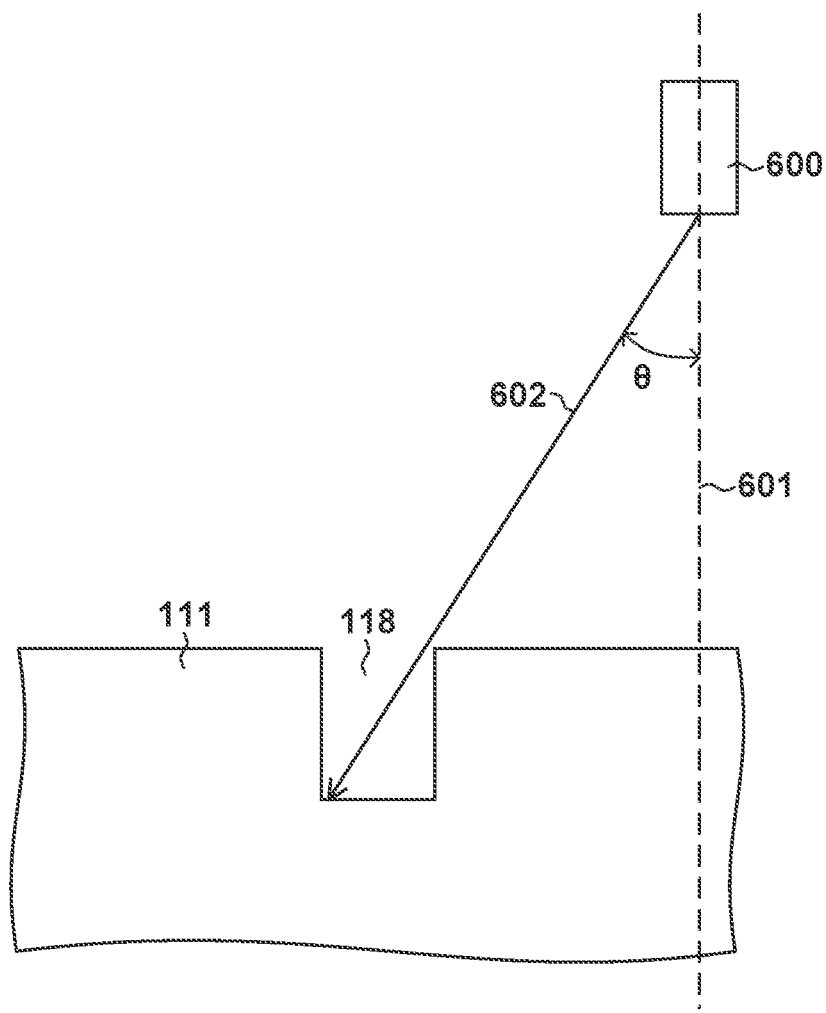
FIG. 6 is a schematic view for explaining an example of the deposition method of a low resistance layer according to the first embodiment.

With reference to FIG. 6, the vapor deposition method of the low resistance layer 201 will be described. An organic material for forming the low resistance layer 201 is discharged from a vapor deposition source 600 toward the surface of the insulating layer 111. When forming the low resistance layer 201, an angle θ formed by a direction 601 orthogonal to the surface of the insulating layer 111 and a trajectory 602 of the organic material toward the groove 118 is set to be larger than 0°. In vacuum vapor deposition, the trajectory 602 of the organic substance evaporating from the vapor deposition source 600 toward the groove 118 is substantially a straight line. Therefore, shadowing occurs in the groove 118, and the film thickness of the low resistance layer 201 varies. More specifically, the film thickness of the low resistance layer 201 decreases in the groove 118, and in some cases, the film thickness becomes 0 (that is, the low resistance layer 201 is interrupted). In this manner, the low resistance layer 201 having the shape shown in FIG. 2 is formed.

Figure 7A:
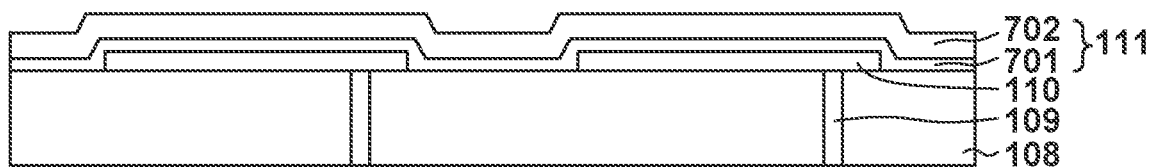
FIGS. 7A to 7C are sectional views for explaining an example of the manufacturing method of the light emitting device according to a modification of the first embodiment.
Figure 7B:
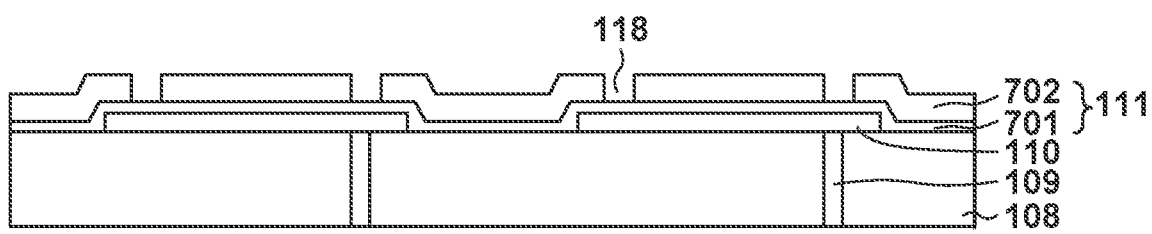
Figure 7C:
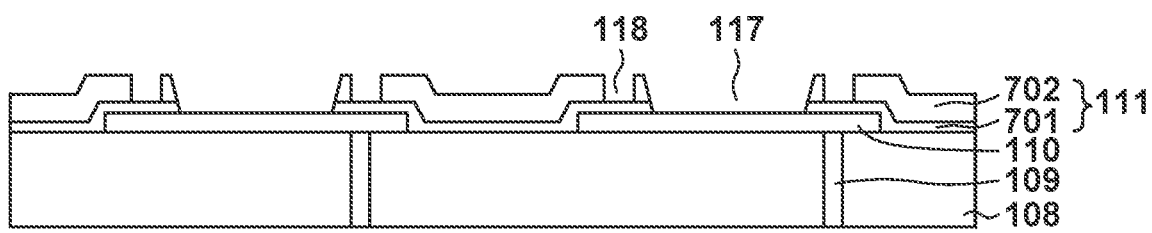

With reference to FIGS. 7A to 7C, a modification of the formation method of the insulating layer 111 will be described. In this modification, in place of the steps shown in FIGS. 5B to 5D, steps shown in FIGS. 7A to 7C are performed. The remaining steps may be similar to those in the above-described embodiment.

As shown in FIG. 7A, the insulating layer 111 having a stacked structure including an insulating layer 701 and an insulating layer 702 is formed on the plurality of lower electrodes 110. More specifically, first, the insulating layer 701 is formed by depositing, on the plurality of lower electrodes 110, an insulating layer such as, for example, an oxide film (SiOx), an oxynitride film (SiON), or a silicon nitride film (SiNx) by the plasma CVD method. The film thickness of the insulating layer 701 may be, for example, 1 nm to 50 nm. Thereafter, the insulating layer 702 is generated by depositing, on the insulating layer 701, an insulating layer such as, for example, an oxide film (SiOx), an oxynitride film (SiON), or a silicon nitride film (SiNx) by the plasma CVD method. The film thickness of the insulating layer 702 may be, for example, 10 nm to 500 nm. The material of the insulating layer 702 is different from the material of the insulating layer 701. For example, the insulating layer 701 may be a silicon nitride film (SiNx), and the insulating layer 702 may be an oxide film (SiOx).

The deposition method of each of the insulating layers 701 and 702 is not limited to the method described above, and an arbitrary method of forming an insulating layer may be used. For example, as a manufacturing method other than the above-described method, the high-density plasma CVD method, the atomic layer deposition (ALD) method, the sputtering method, or spin coating or slit coating of a coating material may be used.

The insulating layer 701 may be formed by stacking a plurality of layers. For example, the insulating layer 701 may be formed by depositing a silicon nitride film (SiNx) after depositing an oxide film (SiOx). If the lower electrode 110 is formed of indium tin oxide (ITO), the CVD method using a silane gas may not uniformly deposit a silicon nitride film (SiNx). Therefore, the insulating layer 701 may be formed on the lower electrode 110 formed of ITO by depositing an oxide film (SiOx) and stacking a silicon nitride film (SiNx) thereon.

Then, as shown in FIG. 7B, the groove 118 is formed by patterning the insulating layer 111 into a predetermined shape using the photolithography method and the dry etching method or the wet etching method. The groove 118 is formed at a position overlapping the outer region 204 of the individual lower electrode 110. In this etching, the insulating layer 701 serves as an etching stop layer. Accordingly, the groove 118 extends through the insulating layer 702 and reaches the insulating layer 701. The insulating layer 701 serves as the bottom of the groove 118. Since the insulting layer 701 serves as the etching stop layer, a variation in depth of the groove 118 at multiple positions is reduced, and the effect of reducing the leak current can be uniformly achieved.

Further, as shown in FIG. 7C, the opening 117 is formed by patterning the insulating layer 111 into a predetermined shape using the photolithography method and the dry etching method or the wet etching method. The opening 117 is formed at a position overlapping the inner region 203 of the individual lower electrode 110. The groove 118 may be formed after the opening 117. Of the opening 117, the insulating layer 701 portion and the insulating layer 702 portion may have taper angles different from each other.

Figure 8A:
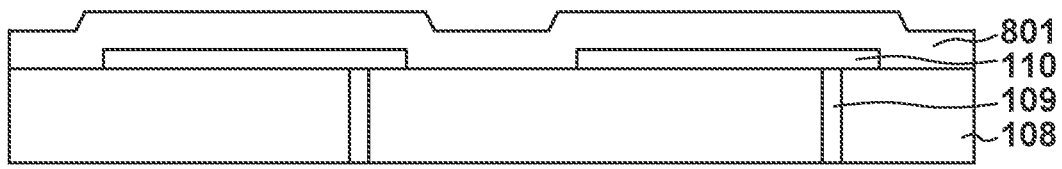
FIGS. 8A to 8C are sectional views for explaining an example of the manufacturing method of the light emitting device according to another modification of the first embodiment.
Figure 8B:
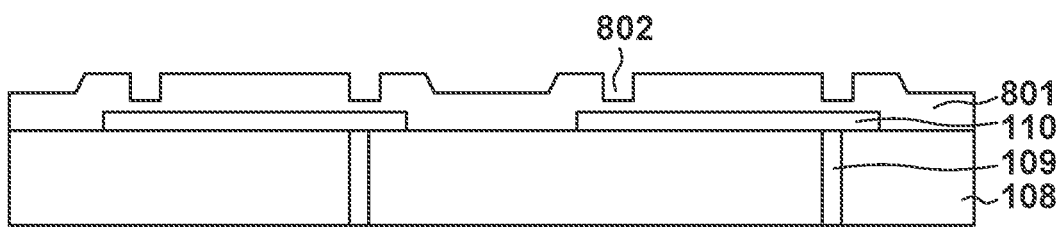
Figure 8C:
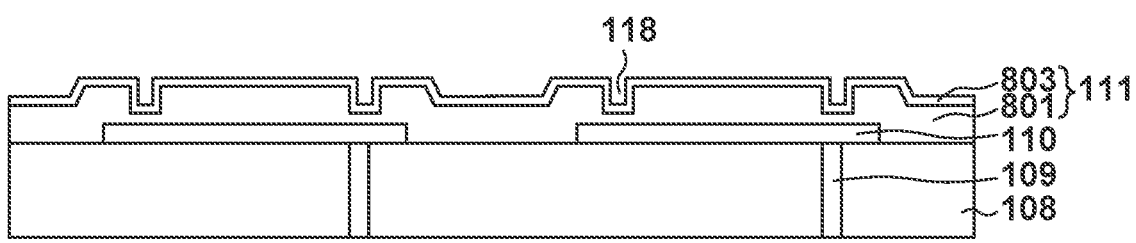

With reference to FIGS. 8A to 8C, another modification of the formation method of the insulating layer 111 will be described. In this modification, in place of the steps shown in FIGS. 5B and 5C, steps shown in FIGS. 8A to 8C are performed. The remaining steps may be similar to those in the above-described embodiment.

As shown in FIG. 8A, an insulating layer 801 is formed on the plurality of lower electrodes 110. More specifically, the insulating layer 801 is formed by depositing, on the plurality of lower electrodes 110, an insulating layer such as, for example, an oxide film (SiOx), an oxynitride film (SiON), or a silicon nitride film (SiNx) by the plasma CVD method.

Then, as shown in FIG. 8B, a groove 802 is formed by patterning the insulating layer 801 into a predetermined shape using the photolithography method and the dry etching method or the wet etching method. The groove 802 is formed at a position overlapping the outer region 204 of the individual lower electrode 110.

Then, as shown in FIG. 8C, an insulating layer 803 is formed on the insulating layer 801. More specifically, the insulating layer 803 is formed by depositing, on the insulating layer 801, an insulating layer such as, for example, an oxide film (SiOx), an oxynitride film (SiON), or a silicon nitride film (SiNx) by the plasma CVD method. A part of the insulating layer 803 enters the groove 802, thereby forming the groove 118. A combination of the insulating layer 801 and the insulating layer 803 serves as the insulating layer 111. In this manner, by further depositing the insulating layer 803 after the groove 802 is formed, the groove 118 having a higher aspect ratio than the groove 802 can be formed.

The deposition method of each of the insulating layers 801 and 803 is not limited to the method described above, and an arbitrary method of forming an insulating layer may be used. For example, as a manufacturing method other than the above-described method, the high-density plasma CVD method, the atomic layer deposition (ALD) method, the sputtering method, or spin coating or slit coating of an application material may be used.

Second Embodiment

Figure 9A:
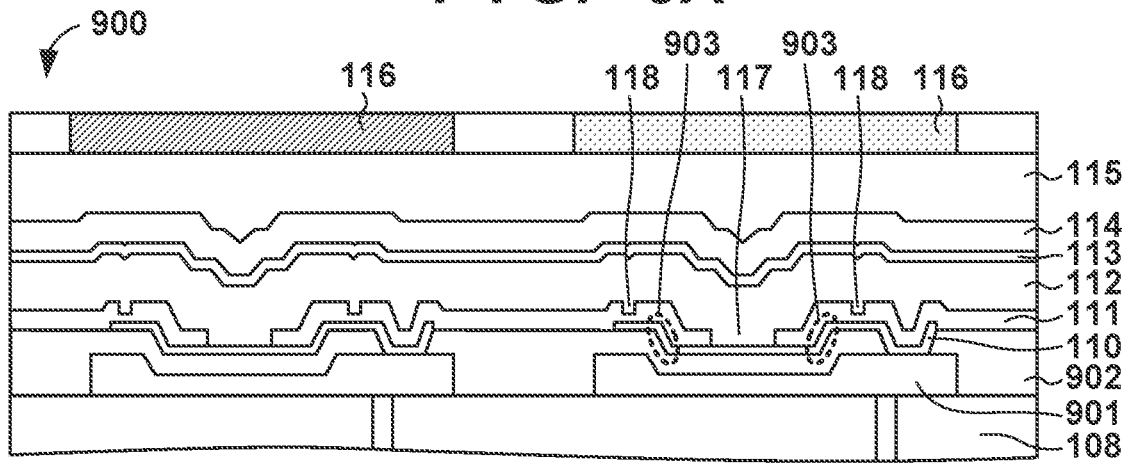
FIGS. 9A to 9C are sectional views each for explaining an arrangement example of a light emitting device according to the second embodiment.
Figure 9B:
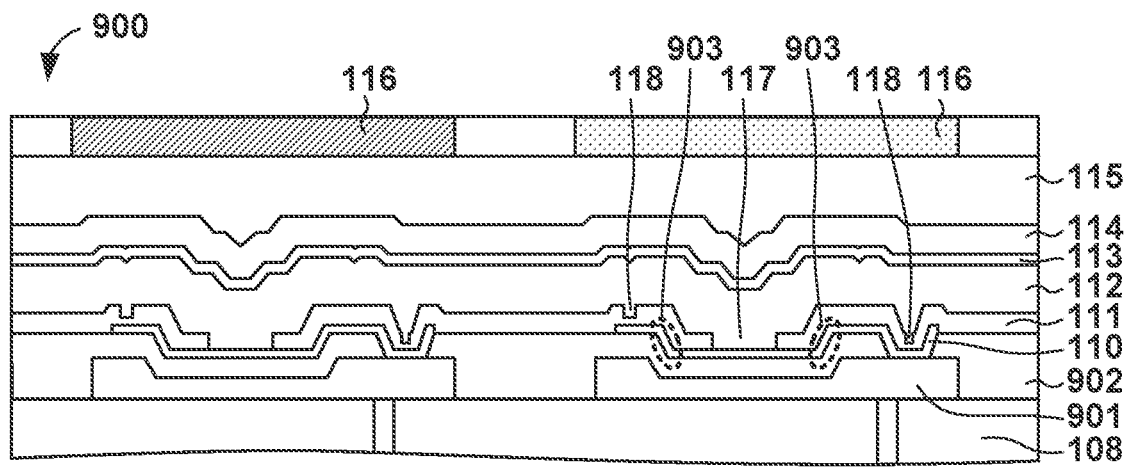
Figure 9C:
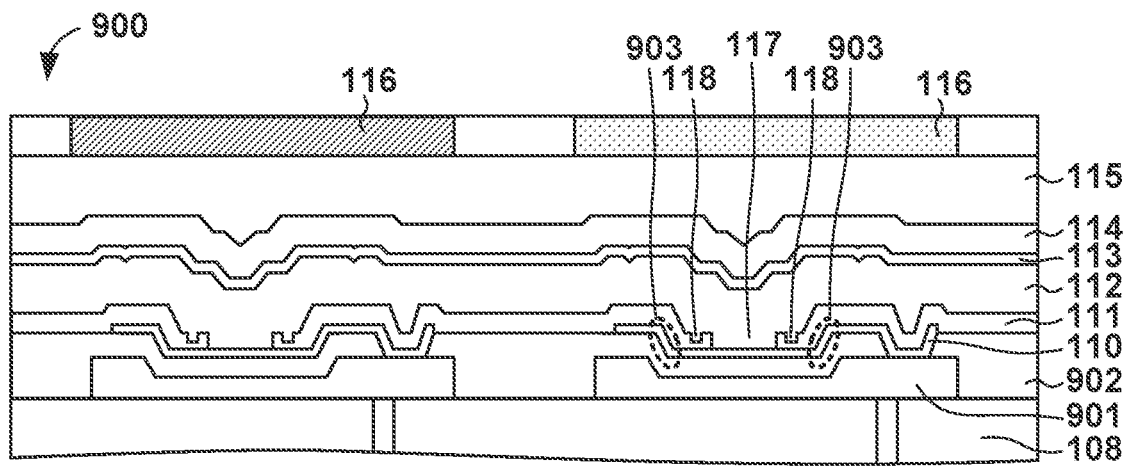

With reference to FIGS. 9A to 9C, an arrangement example of a light emitting device 900 according to the second embodiment will be described. In the following description, differences from the first embodiment will be described, and a description of parts in common with the first embodiment will be omitted. The modifications described in the first embodiment are also applicable in the second embodiment. FIG. 9A shows a sectional view of the light emitting device 900 taken at the same position as in FIG. 1.

In addition to the components of the light emitting device 100, the light emitting device 900 further includes a reflecting layer 901 and an insulating layer 902. The reflecting layer 901 is located below an individual lower electrode 110. The reflecting layer 901 is made of, for example, a metal. The lower electrode 110 of the light emitting device 900 has a light transmitting property. Light generated in an organic layer 112 and transmitted through the lower electrode 110 is reflected by the reflecting layer 901, passes through the lower electrode 110 again, and is emitted to the outside of the light emitting device 900. With this, the intensity of the light emitted from the light emitting device 900 can be increased. The distance between the reflecting layer 901 and the lower electrode 110 is set to the optical path length that increases the intensity of light.

The insulating layer 902 is arranged between the reflecting layer 901 and the lower electrode 110. In a planar view with respect to an inner region 203 of the lower electrode 110, a part of the lower electrode 110 is joined to the reflecting layer 901. In the planar view with respect to the inner region 203, a groove 118 is located between a portion where the lower electrode 110 is joined to the reflecting layer 901 and the inner region 203.

An outer region 204 of the lower electrode 110 includes a step 903 rising from the inside toward the outside along with the shape of the upper surface of the reflecting layer 901. The groove 118 is located at a position overlapping the flat portion of the outer region 204 on the outer side of the step 903.

With reference to FIG. 9B, a modification of the light emitting device 900 will be described. In this modification, the groove 118 is located at a position overlapping a portion where the lower electrode 110 is joined to the reflecting layer 901. In photolithography for forming the groove 118 at this position, a multilayer resist process may be used to reduce the influence of the step and improve the focus depth.

With reference to FIG. 9C, another modification of the light emitting device 900 will be described. In this modification, the groove 118 is located at a position overlapping the flat portion of the outer region 204 on the inner side of the step 903. With this, the groove 118 can be located close to the inner region 203.

Third Embodiment

Figure 10A:
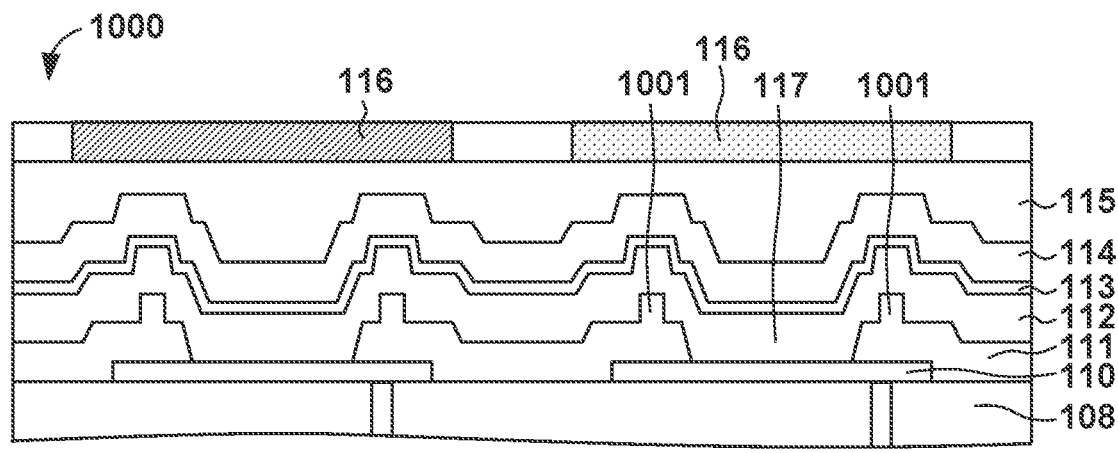
FIG. 10A is a sectional view for explaining an arrangement example of a light emitting device according to the third embodiment.

With reference to FIG. 10A, an arrangement example of a light emitting device 1000 according to the third embodiment will be described. In the following description, differences from the first embodiment will be described, and a description of parts in common with the first embodiment will be omitted. The modifications described in the first embodiment are also applicable in the third embodiment. Differences between the first embodiment and the third embodiment can be applied to the second embodiment. FIG. 10A shows a sectional view of the light emitting device 1000 taken at the same position as in FIG. 1.

The light emitting device 1000 is different from the light emitting device 100 in that an insulating layer 111 includes a convex portion 1001 instead of a groove 118. The convex portion 1001 is located at a position away from an opening 117 and overlapping the flat portion of an outer region 204. Two steps (that is, a step close to an inner region 203 and a step away from the inner region 203) are formed by the convex portion 1001.

When forming, by deposition, a low resistance layer 201 on the insulating layer 111 including the convex portion 1001 as described above, the thickness of the low resistance layer 201 in a portion covering the side wall of the convex portion 1001 becomes smaller than the thickness of the low resistance layer 201 in a portion covering the vicinity of the convex portion 1001 and the upper portion of the convex portion 1001. As a result, as in the first embodiment, a leak current flowing over the convex portion 1001 can be reduced. Similar to the groove 118 described with reference to FIG. 3, the convex portion 1001 may wholly surround the inner region 203 in a planar view with respect to the inner region 203. Similar to the groove 118, the convex portion 1001 may be formed by patterning the insulating layer 111.

Fourth Embodiment

Figure 10B:
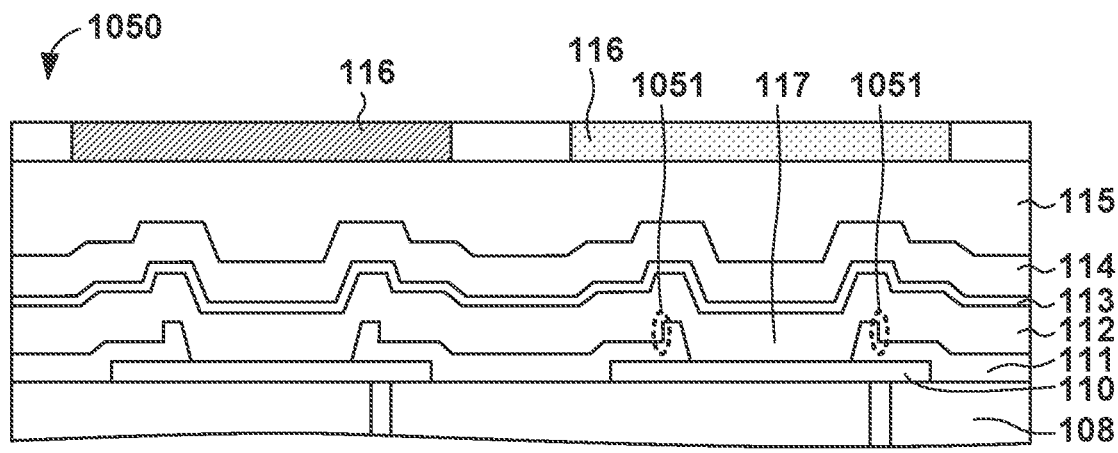
FIG. 10B is a sectional view for explaining an arrangement example of a light emitting device according to the fourth embodiment.

With reference to FIG. 10B, an arrangement example of a light emitting device 1050 according to the fourth embodiment will be described. In the following description, differences from the first embodiment will be described, and a description of parts in common with the first embodiment will be omitted. The modifications described in the first embodiment are also applicable in the fourth embodiment. Differences between the first embodiment and the fourth embodiment can be applied to the second embodiment. FIG. 10B shows a sectional view of the light emitting device 1050 taken at the same position as in FIG. 1.

The light emitting device 1050 is different from the light emitting device 100 in that an insulating layer 111 includes a step 1051 instead of a groove 118. The step 1051 is located at a position away from an opening 117 and overlapping the flat portion of an outer region 204.

When forming, by deposition, a low resistance layer 201 on the insulting layer 111 including the step 1051 as described above, the thickness of the low resistance layer 201 in a portion covering the side wall of the step 1051 becomes smaller than the thickness of the low resistance layer 201 in a portion covering the vicinity of the step 1051. As a result, as in the first embodiment, a leak current flowing over the step 1051 can be reduced. Similar to the groove 118 described with reference to FIG. 3, the step 1051 may wholly surround an inner region 203 in a planar view with respect to the inner region 203. Similar to the groove 118, the step 1051 may be formed by patterning the insulating layer 111.

Fifth Embodiment

Figure 11A:
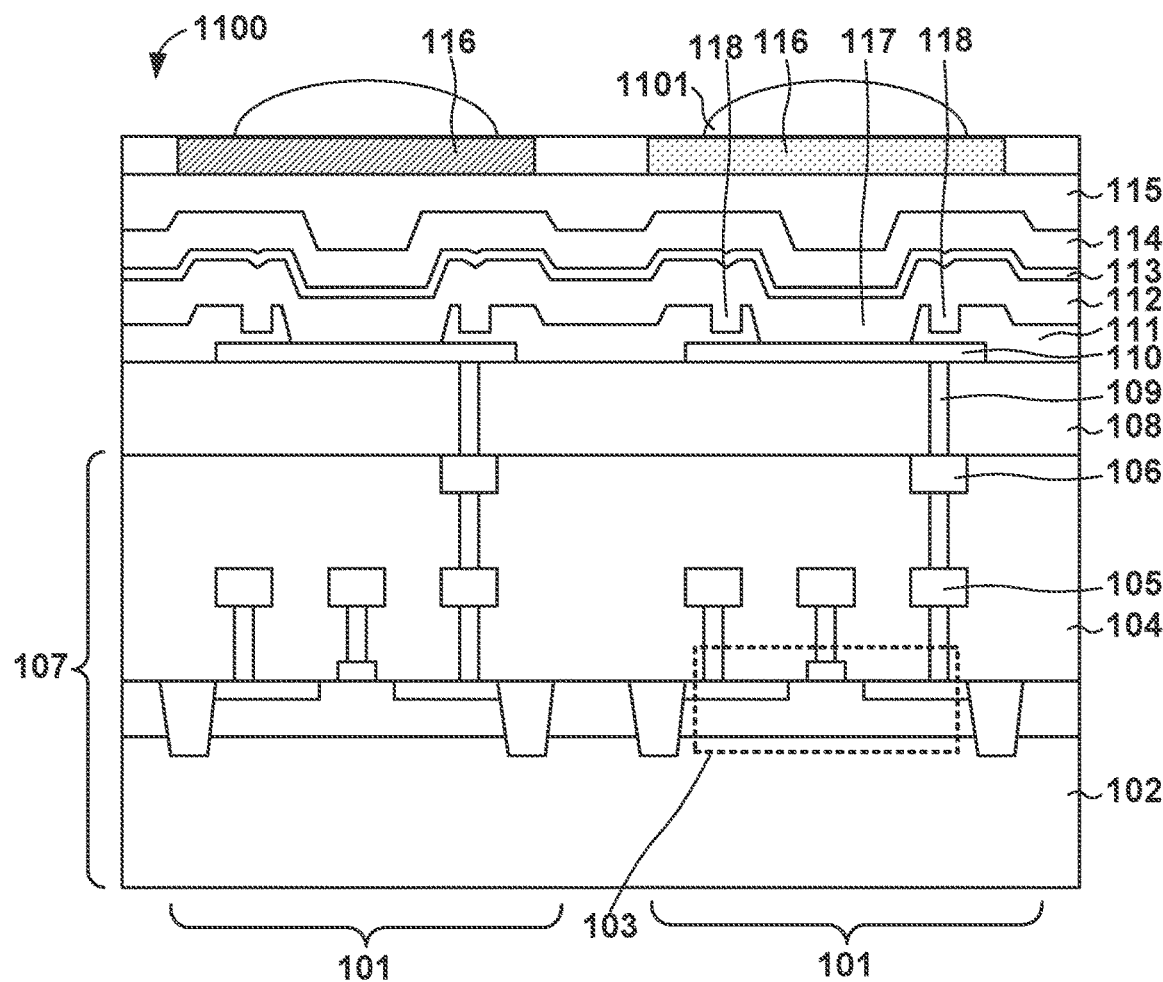
FIG. 11A is a sectional view for explaining an arrangement example of a light emitting device according to the fifth embodiment.
Figure 11B:
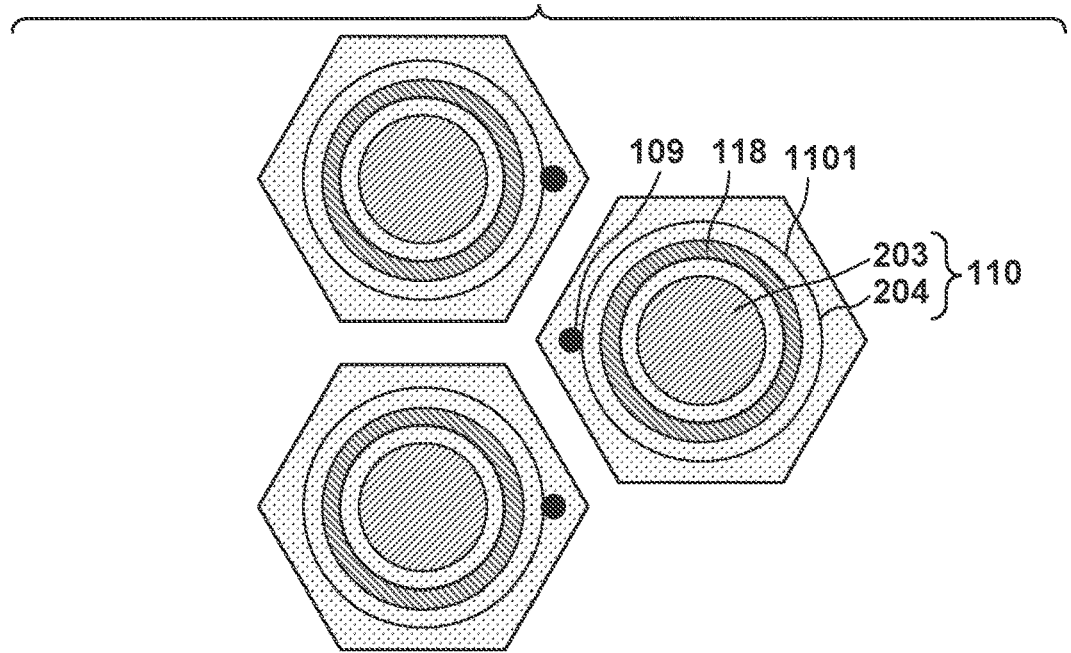
FIG. 11B is a plan view for explaining the arrangement example of the light emitting device according to the fifth embodiment.

With reference to FIGS. 11A and 11B, an arrangement example of a light emitting device 1100 according to the fifth embodiment will be described. In the following description, differences from the first embodiment will be described, and a description of parts in common with the first embodiment will be omitted. The modifications described in the first embodiment are also applicable in the fifth embodiment. Differences between the first embodiment and the fifth embodiment are applicable to any of the second to fourth embodiments. FIG. 11A shows a sectional view of the light emitting device 1100 taken at the same position as in FIG. 1.

The light emitting device 1100 is different from the light emitting device 100 in that it further includes a plurality of microlenses 1101 above an upper electrode 113. The remaining parts may be similar to those of the light emitting device 100. The microlens 1101 has a light transmitting property. The individual microlens 1101 is formed for each of a plurality of light emitting circuits 101. The microlens 1101 projects upward from a color filter 116. The microlens 1101 is convex. The microlens may be a spherical lens, or may be an aspherical lens. The constituent material of the microlens 1101 may be a material having a light transmitting property and an insulating property. For example, the constituent material of the microlens 1101 may be an inorganic silicon material such as silicon oxide, or a resin material such as acryl resin.

With reference to FIG. 11B, a plan view of the light emitting device 1100 will be described. More specifically, FIG. 11B shows the arrangement of a contact plug 109, a lower electrode 110, a groove 118, and the microlens 1101 in a planar view with respect to the principal surface of a substrate 102.

The shape of the microlens 1101 in the planar view is not particularly limited, but it is a circular shape in the example shown in FIG. 11B. One microlens 1101 is arranged so as to correspond to one lower electrode 110. The microlens 1101 wholly overlaps an inner region 203 in the planar view. Alternatively, the microlens 1101 may overlap only a part of the inner region 203. In the planar view with respect to the principal surface of the substrate 102, the area of the microlens 1101 is larger than the area of the inner region 203. Alternatively, the area of the microlens 1101 may be equal to or smaller than the area of the inner region 203.

In the example shown in FIG. 11B, the groove 118 of an insulating layer 111 is located at a position overlapping the microlens 1101. Alternatively, the groove 118 of the insulating layer 111 may be located at a position partially overlapping the microlens 1101, or may be located at a position not overlapping the microlens 1101. A plurality of microlenses 1101 may have different sizes. By designing such that light emitted in the inner region 203 on the inner side of the groove 118 can enter the microlens 1101, it is possible to improve the visual field angle characteristics by the microlens 1101 while suppressing color mixing.

In the embodiments described above, the organic layer 112 includes the low resistance layer 201, and the thickness of the low resistance layer 201 is decreased by forming the low resistance layer 201 on the insulating layer 111 including the groove 118, the convex portion 1001, or the step 1051. Alternatively, the organic layer 112 may not include the low resistance layer 201. In this case, the light emitting layer 202 may be in contact with the inner region 203 of the lower electrode 110 and the insulating layer 111. Even with this arrangement, by forming the light emitting layer 202 on the insulating layer 111 including the groove 118, the convex portion 1001, or the step 1051, the thickness of the light emitting layer 202 can be partially decreased. As a result, a leak current is reduced.

[Arrangement of Organic Light Emitting Element]

The organic light emitting element is formed by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

[Substrate]

Quartz, glass, a silicon wafer, a resin, a metal, or the like may be used as a substrate. Furthermore, a switching element such as a transistor and a wiring may be provided on the substrate, and an insulating layer may be provided thereon. The insulating layer can be made of any material as long as a contact hole can be formed so that the wiring can be formed between the insulating layer and the first electrode and insulation from the unconnected wiring can be ensured. For example, a resin such as polyimide, silicon oxide, or silicon nitride can be used.

[Electrode]

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode, and the electrode that supplies electrons is the cathode.

As the constituent material of the anode, a material having a work function as large as possible is preferably used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function is preferably used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. In particular, silver may be used. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is used to provide the good film coverage and easily lower the resistance.

[Organic Compound Layer]

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

[Protection Layer]

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by the CVD method. The protection layer may be provided using an atomic layer deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

[Color Filter]

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

[Planarizing Layer]

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. The planarizing layer may be made of a polymeric material.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

[Microlens]

The organic light emitting device can include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

[Counter Substrate]

A counter substrate can be provided on the planarizing layer. The counter substrate is called a counter substrate because it is provided at a position corresponding to the above-described substrate. The constituent material of the counter substrate can be the same as that of the above-described substrate. When the above-described substrate is the first substrate, the counter substrate can be the second substrate.

[Organic Layer]

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

[Pixel Circuit]

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

[Pixel]

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

[Application of Organic Light Emitting Element of Embodiment of Present Invention]

The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer may have a touch panel function. The driving type of the touch panel function may be an infrared type, a capacitance type, a resistive film type, or an electromagnetic induction type, and is not particularly limited. The display device may be used for the display unit of a multifunction printer.

Next, with reference to the drawing, a display device according to this embodiment will be described. In the following embodiment, the display device may be formed from the light emitting device (for example, light emitting device 100) according to any of the above-described embodiments.

Figure 12:
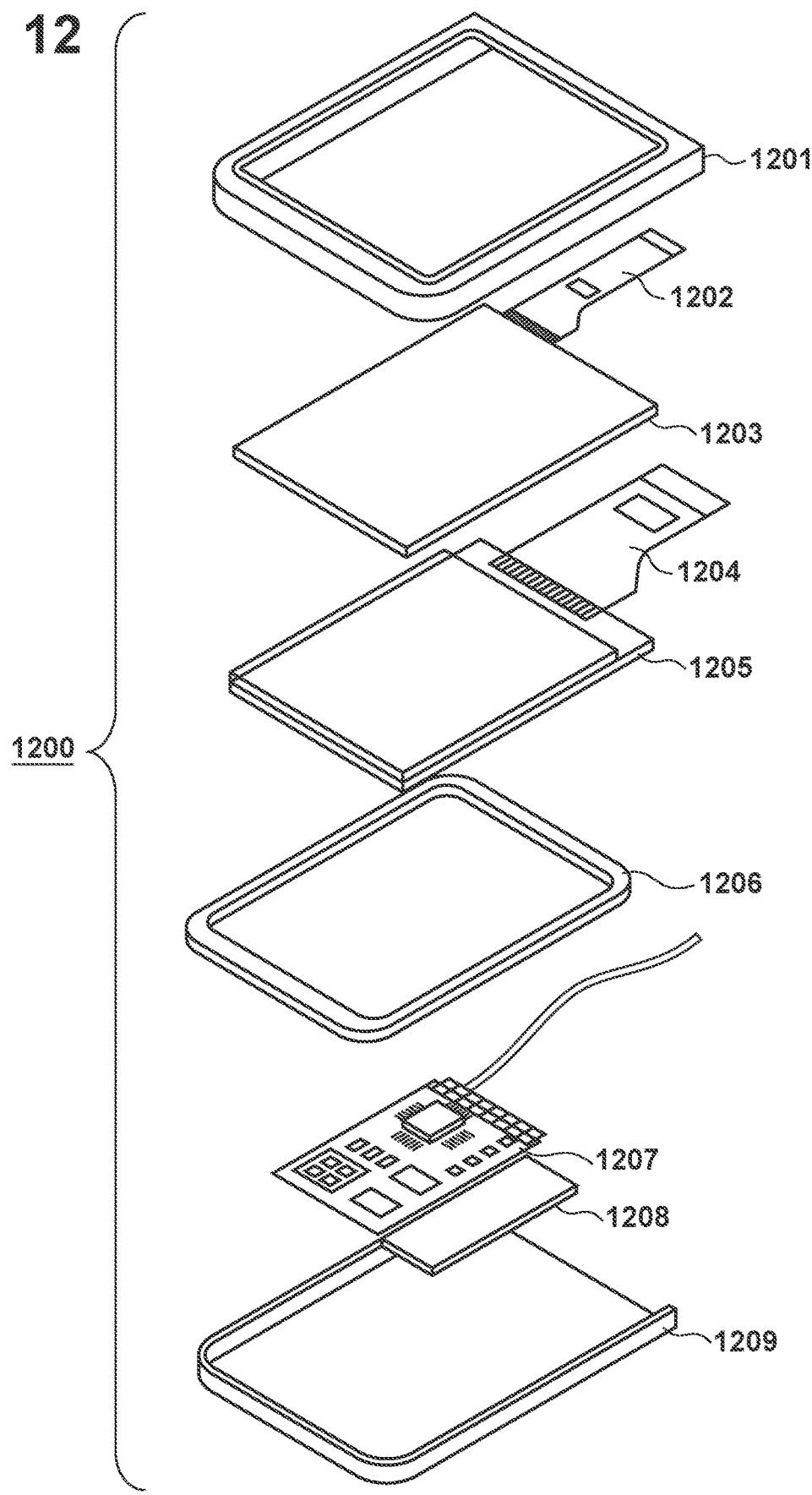
FIG. 12 is a view showing an example of a display device using the light emitting device according to the embodiment.

FIG. 12 is a schematic view showing an example of the display device according to this embodiment. The display device 1200 may include, between an upper cover 1201 and a lower cover 1209, a touch panel 1203, a display panel 1205, a frame 1206, a circuit board 1207, and a battery 1208. The touch panel 1203 and the display panel 1205 are connected to flexible printed circuit FPCs 1202 and 1204, respectively. Transistors are printed on the circuit board 1207. The battery 1208 may not be provided if the display device is not a portable apparatus, or may be provided in another position even if the display device is a portable apparatus.

The display device according to this embodiment may include color filters of red, green, and blue. The color filters of red, green, and blue may be arranged in a delta array.

The display device according to this embodiment may also be used for a display unit of a portable terminal. At this time, the display unit may have both a display function and an operation function. Examples of the portable terminal are a portable phone such as a smartphone, a tablet, and a head mounted display.

The display device according to this embodiment may be used for a display unit of an image capturing device including an optical unit having a plurality of lenses, and an image sensor for receiving light having passed through the optical unit. The image capturing device may include a display unit for displaying information acquired by the image sensor. In addition, the display unit may be either a display unit exposed outside the image capturing device, or a display unit arranged in the finder. The image capturing device may be a digital camera or a digital video camera.

Figure 13A:
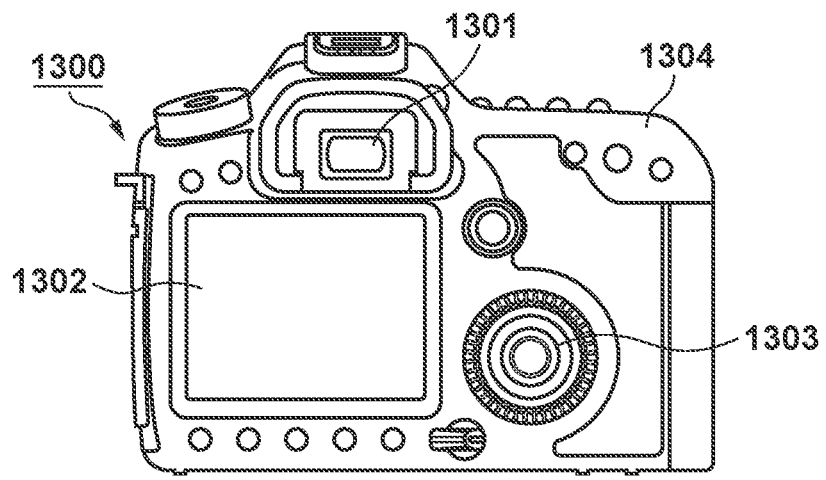
FIG. 13A is a view showing an example of a photoelectric conversion device using the light emitting device according to the embodiment.

FIG. 13A is a schematic view showing an example of the image capturing device according to this embodiment. An image capturing device 1300 may include a viewfinder 1301, a rear display 1302, an operation unit 1303, and a housing 1304. The viewfinder 1301 may include the display device according to this embodiment. In this case, the display device may display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time, so the information is preferably displayed as soon as possible. Therefore, the display device using the organic light emitting element of the present invention may be used. This is so because the organic light emitting element has a high response speed. The display device using the organic light emitting element is superior to a liquid crystal display device in the apparatuses that require a high display speed.

The image capturing device 1300 includes an optical unit (not shown). This optical unit includes a plurality of lenses, and forms an image on an image sensor that is accommodated in the housing 1304. The focal points of the plurality of lenses can be adjusted by adjusting the relative positions. This operation can also automatically be performed. The image capturing device may be called a photoelectric conversion device. Instead of sequentially capturing an image, the photoelectric conversion device can include, as an image capturing method, a method of detecting the difference from a previous image, a method of extracting an image from an always recorded image, or the like.

Figure 13B:
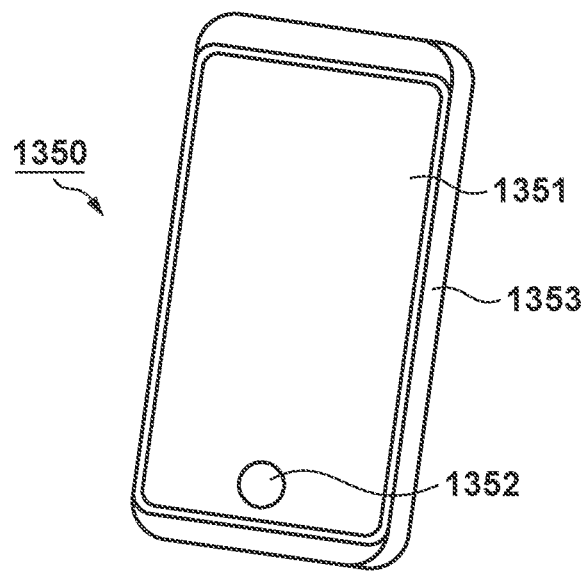
FIG. 13B is a view showing an example of an electronic apparatus using the light emitting device according to the embodiment.

FIG. 13B is a schematic view showing an example of an electronic apparatus according to this embodiment. An electronic apparatus 1350 includes a display unit 1351, an operation unit 1352, and a housing 1353. The housing 1353 may accommodate a circuit, a printed board including this circuit, a battery, and a communication unit. The operation unit 1352 may be a button or a touch-panel-type reaction unit. The operation unit may also be a biometric authentication unit that performs unlocking or the like by authenticating a fingerprint. The electronic apparatus including the communication unit can also be regarded as a communication apparatus. The electronic apparatus may further have a camera function by including a lens and an image sensor. An image captured by the camera function is displayed on the display unit. Examples of the electronic apparatus are a smartphone and a laptop computer.

Figure 14A:
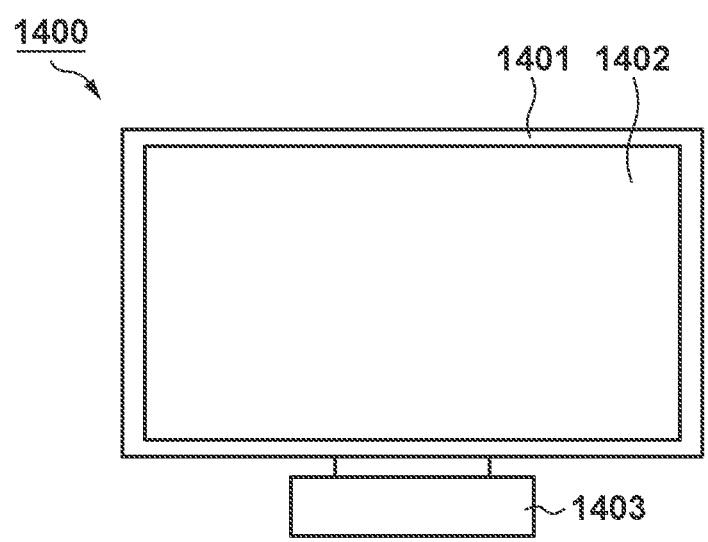
FIGS. 14A and 14B are views each showing an example of a display device using the light emitting device according to the embodiment.
Figure 14B:
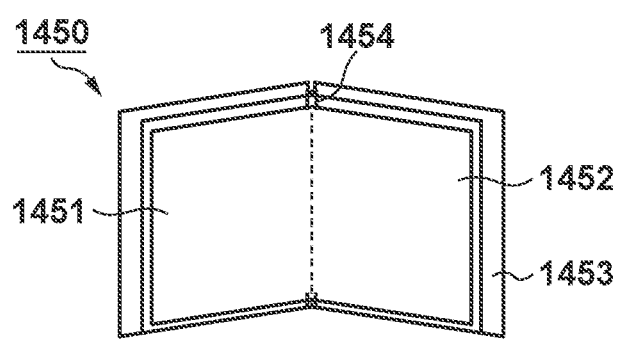

FIGS. 14A and 14B are schematic views showing examples of the display device according to this embodiment. FIG. 14A shows a display device such as a television monitor or a PC monitor. A display device 1400 includes a frame 1401 and a display unit 1402. The light emitting device according to this embodiment may be used in the display unit 1402.

The display device 1400 includes a base 1403 that supports the frame 1401 and the display unit 1402. The base 1403 is not limited to the form shown in FIG. 14A. The lower side of the frame 1401 may also function as the base.

In addition, the frame 1401 and the display unit 1402 may be bent. The radius of curvature may be 5,000 mm (inclusive) to 6,000 mm (inclusive).

FIG. 14B is a schematic view showing another example of the display device according to this embodiment. A display device 1450 shown in FIG. 14B is configured to be foldable, that is, the display device 1450 is a so-called foldable display device. The display device 1450 includes a first display unit 1451, a second display unit 1452, a housing 1453, and a bending point 1454. Each of the first display unit 1451 and the second display unit 1452 may include the light emitting device according to this embodiment. The first display unit 1451 and the second display unit 1452 may also be one seamless display device. The first display unit 1451 and the second display unit 1452 can be divided by the bending point. The first display unit 1451 and the second display unit 1452 may display different images, and may display one image together.

Figure 15A:
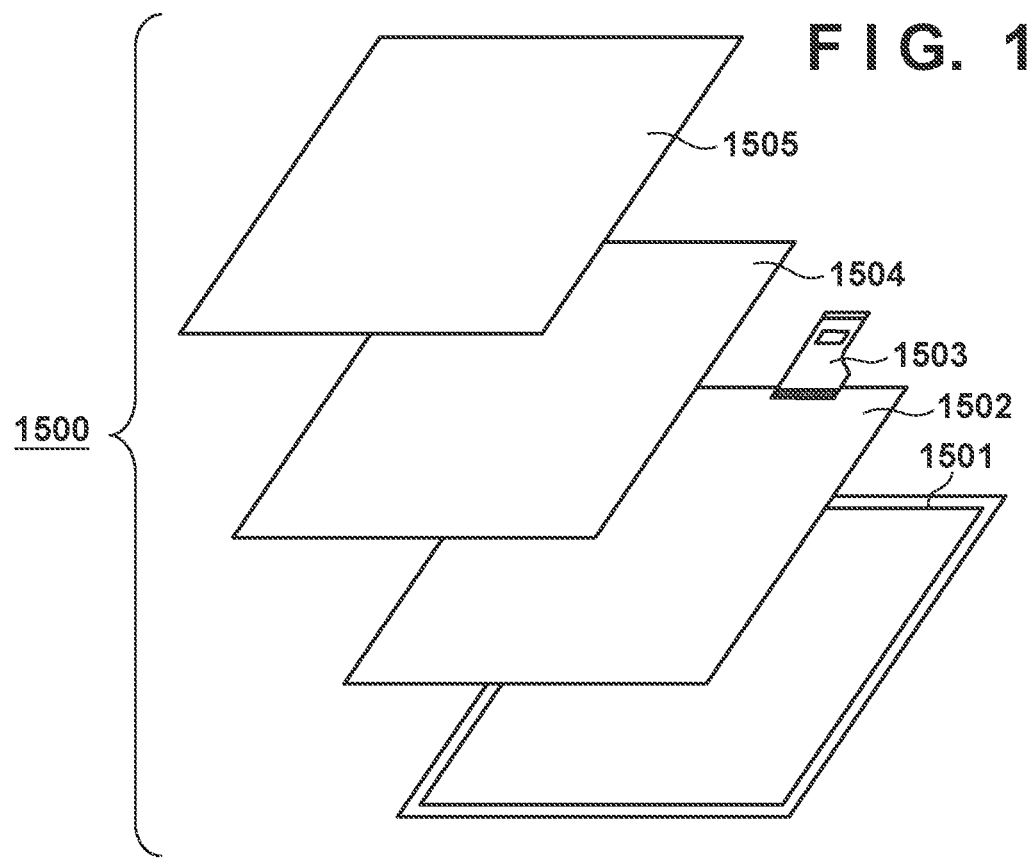
FIG. 15A is a view showing an example of an illumination device using the light emitting device according to the embodiment.

FIG. 15A is a schematic view showing an example of an illumination device according to this embodiment. An illumination device 1500 may include a housing 1501, a light source 1502, a circuit board 1503, an optical film 1504, and a light-diffusing unit 1505. The light source may include the organic light emitting element according to this embodiment. The optical film may be a filter that improves the color rendering of the light source. When performing lighting-up or the like, the light-diffusing unit can throw the light of the light source over a broad range by effectively diffusing the light. The optical film and the light-diffusing unit may be provided on the illumination light emission side. The illumination device may also include a cover on the outermost portion, as needed.

The illumination device is, for example, a device for illuminating the interior of the room. The illumination device may emit white light, natural white light, or light of another color from blue to red. The illumination device may include a light control circuit for controlling these light components. The illumination device may include the organic light emitting element according to the present invention and a power supply circuit connected to the organic light emitting element. The power supply circuit is a circuit for converting an AC voltage into a DC voltage. White has a color temperature of 4,200 K, and natural white has a color temperature of 5,000 K. The illumination device may also include a color filter.

In addition, the illumination device according to this embodiment may include a heat radiation unit. The heat radiation unit radiates the internal heat of the device to the outside of the device, and examples are a metal having a high specific heat and liquid silicon.

Figure 15B:
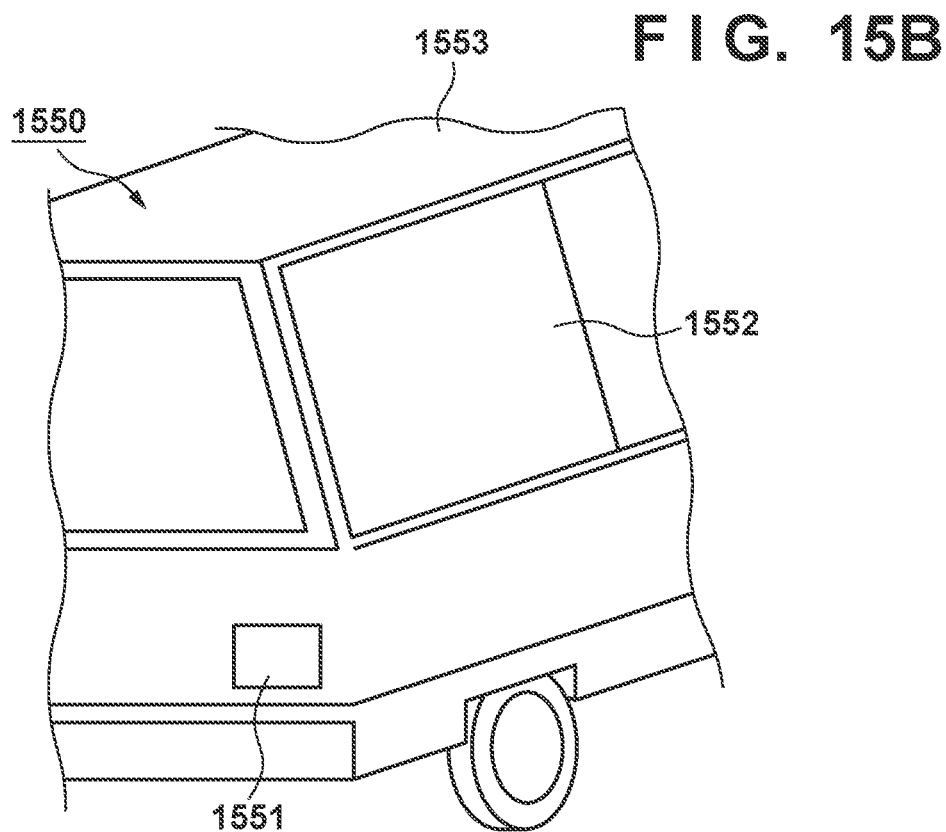
FIG. 15B is a view showing an example of a moving body using the light emitting device according to the embodiment.

FIG. 15B is a schematic view of an automobile as an example of a moving body according to this embodiment. The automobile has a taillight as an example of the lighting appliance. An automobile 1550 has a taillight 1551, and may have a form in which the taillight is turned on when performing a braking operation or the like.

The taillight 1551 may include the organic light emitting element according to this embodiment. The taillight may include a protection member for protecting the organic EL element. The material of the protection member is not limited as long as the material is a transparent material with a strength that is high to some extent, and may be made of polycarbonate or the like. A furandicarboxylic acid derivative, an acrylonitrile derivative, or the like may be mixed in polycarbonate.

The automobile 1550 may include a vehicle body 1553, and a window 1552 attached to the vehicle body 1553. The window may be a transparent display as long as it is not a window for checking the front or rear of the automobile. This transparent display may include the organic light emitting element according to this embodiment. In this case, the constituent materials of the electrodes and the like of the organic light emitting element are formed from transparent members.

The moving body according to this embodiment may be a ship, an airplane, a drone, or the like. The moving body may include a main body and a lighting appliance provided on the main body. The lighting appliance may emit light for making a notification of the position of the main body. The lighting appliance includes the organic light emitting element according to this embodiment.

An application example of the display device according to each embodiment described above will be described with reference to FIGS. 16A and 16B. The display device can be applied to a system that can be worn as a wearable device such as smartglasses, an HMD, or a smart contact lens. An image capturing display device used in such an application example includes an image capturing device capable of photoelectrically converting visible light and a display device capable of emitting visible light.

Figure 16A:
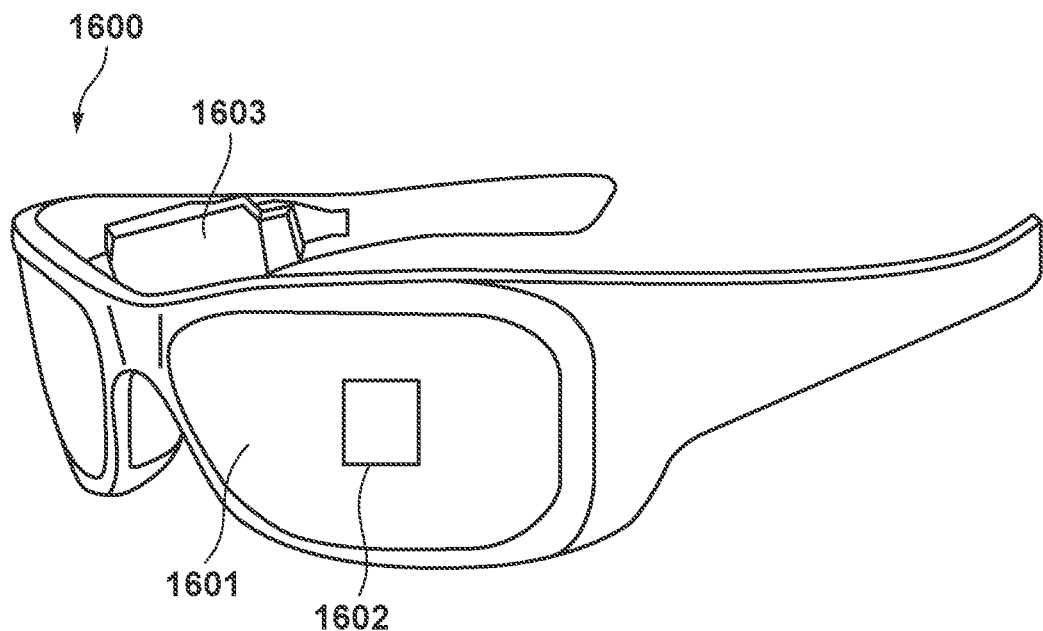
FIGS. 16A and 16B are views each showing an example of a wearable device using the light emitting device according to the embodiment.

Glasses 1600 (smartglasses) according to one application example will be described with reference to FIG. 16A. An image capturing device 1602 such as a CMOS sensor or an SPAD is provided on the surface side of a lens 1601 of the glasses 1600. In addition, the display device of each of the above-described embodiments is provided on the back surface side of the lens 1601.

The glasses 1600 further includes a control device 1603. The control device 1603 functions as a power supply that supplies power to the image capturing device 1602 and the display device according to each embodiment. In addition, the control device 1603 controls the operations of the image capturing device 1602 and the display device. An optical system configured to condense light to the image capturing device 1602 is formed on the lens 1601.

Figure 16B:
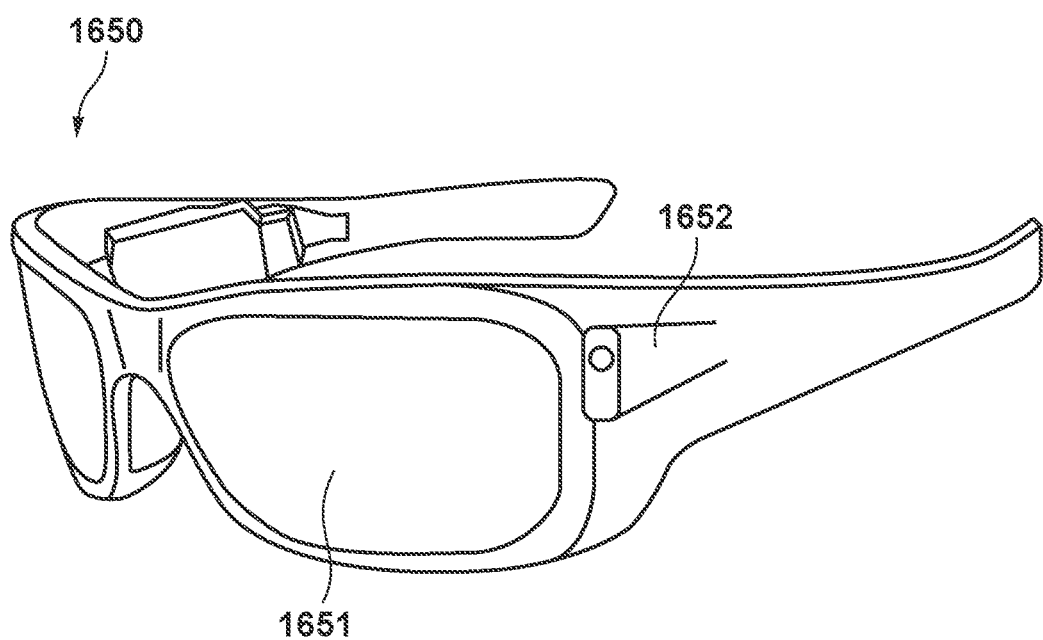

Glasses 1650 (smartglasses) according to one application example will be described with reference to FIG. 16B. The glasses 1650 includes a control device 1652, and an image capturing device corresponding to the image capturing device 1602 and a display device are mounted on the control device 1652. The image capturing device in the control device 1652 and an optical system configured to project light emitted from the display device are formed in a lens 1651, and an image is projected to the lens 1651. The control device 1652 functions as a power supply that supplies power to the image capturing device and the display device, and controls the operations of the image capturing device and the display device. The control device may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display device according to the embodiment of the present invention may include an image capturing device including a light receiving element, and a displayed image on the display device may be controlled based on the line-of-sight information of the user from the image capturing device.

More specifically, the display device decides a first visual field region at which the user is gazing and a second visual field region other than the first visual field region based on the line-of-sight information. The first visual field region and the second visual field region may be decided by the control device of the display device, or those decided by an external control device may be received. In the display region of the display device, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the display device, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the display device, the image capturing device, or an external device. If the external device holds the AI program, it is transmitted to the display device via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-075409, filed Apr. 28, 2022 and Japanese Patent Application No. 2023-028841, filed Feb. 27, 2023, which are hereby incorporated by reference herein in their entirety.

What is claimed is:

1. A light emitting device comprising:
a plurality of first electrodes;
an organic layer located above the plurality of first electrodes and including a light emitting layer;
a second electrode located above the organic layer; and
an insulating layer that separates the plurality of first electrodes from each other,
wherein an upper surface of each of the plurality of first electrodes includes (1) an inner region in contact with the organic layer, and (2) an outer region covered with the insulating layer,
wherein the insulating layer includes (1) an opening that defines the inner region, (2) a first upper surface, (3) a second upper surface farther from the opening than the first upper surface, and (4) a third upper surface located between the first upper surface and the second upper surface,
wherein a slope angle of the third upper surface with respect to a first electrode of the plurality of first electrodes is larger than a slope angle of the first upper surface with respect to the first electrode, and
wherein the light emitting device further comprises a groove located at a position in the first upper surface away from the opening and overlapping the outer region in a planar view.

2. The device according to claim 1, wherein in a planar view with respect to the inner region, the groove wholly surrounds the inner region.

3. The device according to claim 1, wherein the insulating layer has a stacked structure including a first insulating layer and a second insulating layer, the second insulating layer being located above the first insulating layer and being formed of a material different from a material of the first insulating layer, and
wherein the groove extends through the second insulating layer and reaches the first insulating layer.

4. The device according to claim 1, wherein a depth of the groove is not less than 0.3 times to not more than 20 times a width of the groove.

5. The device according to claim 1, wherein the organic layer further includes one of a hole injection layer, a hole transport layer, and a charge generation layer between the light emitting layer and the plurality of first electrodes, and
wherein a distance between a bottom of the groove and the light emitting layer is smaller than a distance between a vicinity of the groove and the light emitting layer.

6. The device according to claim 1, wherein the insulating layer includes a convex portion located at a position away from the opening and overlapping the outer region.

7. The device according to claim 1, wherein the first electrode has a light transmitting property,
wherein the device further comprises a reflecting layer below each of the plurality of first electrodes, and wherein in a planar view with respect to the inner region, the groove is located between the inner region and a portion where the first electrode is joined to the reflecting layer.

8. The device according to claim 1, further comprising a contact plug connected to the first electrode,
wherein, in a planar view with respect to the inner region, the groove is located between the contact plug and the inner region.

9. The device according to claim 1, further comprising a microlens above the second electrode,
wherein the groove is located at a position overlapping the microlens.

10. The device according to claim 1, wherein an area of the inner region is smaller than an area of the outer region.

11. The device according to claim 1, wherein the organic layer further includes one of a hole injection layer, a hole transport layer, and a charge generation layer between the light emitting layer and the plurality of first electrodes.

12. A display device comprising a light emitting device according to claim 1, and an active element connected to the light emitting device.

13. A photoelectric conversion device comprising (1) an optical unit including a plurality of lenses, (2) an image sensor configured to receive light having passed through the optical unit, and (3) a display unit configured to display an image,
wherein the display unit displays an image captured by the image sensor, and includes a light emitting device according to claim 1.

14. An electronic apparatus comprising (1) a housing provided with a display unit, and (2) a communication unit provided in the housing and configured to communicate with an external device,
wherein the display unit includes a light emitting device according to claim 1.

15. An illumination device comprising a light source, and at least one of a light diffusing unit or an optical film,
wherein the light source includes a light emitting device according to claim 1.

16. A moving body comprising a main body, and a lighting appliance provided in the main body,
wherein the lighting appliance includes a light emitting device according to claim 1.

17. A method of manufacturing a light emitting device, the method comprising
forming an insulating layer covering a plurality of first electrodes;
forming a groove in the insulating layer at a position overlapping an outer region of each of the plurality of first electrodes;
forming an opening in the insulating layer at a position overlapping an inner region of each of the plurality of first electrodes;
forming an organic layer including a light emitting layer on the insulating layer where the groove and the opening have been formed; and
forming a second electrode on the organic layer,
wherein the insulating layer includes (1) a first upper surface, (2) a second upper surface farther from the opening than the first upper surface, and (3) a third upper surface located between the first upper surface and the second upper surface,
wherein a slope angle of the third upper surface with respect to a first electrode of the plurality of first electrodes is larger than a slope angle of the first upper surface with respect to the first electrode, and
wherein the groove is formed at a position in the first upper surface away from the opening and overlapping the outer region in a planar view.

18. A light emitting device comprising:
a first light emitting element; and
a second light emitting element,
wherein the first light emitting element includes (1) a first first electrode, (2) a first organic layer including a light emitting layer, and (3) a second electrode, in that order,
wherein the second light emitting element includes (1) a second first electrode, (2) a second organic layer including a light emitting layer, and (3) the second electrode, in that order,
wherein the light emitting device comprises an insulating layer that separates the first first electrode and the second first electrode from each other,
wherein an upper surface of the first first electrode includes (1) an inner region in contact with the first organic layer, and (2) an outer region in contact with the insulating layer,
wherein an upper surface of the second first electrode includes (1) an inner region in contact with the second organic layer, and (2) an outer region in contact with the insulating layer,
wherein the insulating layer includes (1) an opening that defines the inner region of the first first electrode, (2) a first upper surface, (3) a second upper surface farther from the opening than the first upper surface, (4) a third upper surface located between the first upper surface and the second upper surface, (5) a first groove in the first surface, the first groove overlapping the outer region of the first first electrode in a planar view, and (6) a second groove overlapping the outer region of the second first electrode in a planar view,
wherein a slope angle of the third upper surface with respect to the first first electrode is larger than a slope angle of the first upper surface with respect to the first first electrode, and
wherein an aspect ratio of the first groove is different from an aspect ratio of the second groove.

\* \* \* \* \*